(12) United States Patent
Shin et al.

(10) Patent No.: US 11,398,485 B2
(45) Date of Patent: Jul. 26, 2022

(54) SEMICONDUCTOR MEMORY DEVICE

(71) Applicant: Samsung Electronics Co., Ltd., Suwon-si (KR)

(72) Inventors: Dongsuk Shin, Suwon-si (KR); Jiyoung Kim, Yongin-si (KR); Hokyun An, Seoul (KR); Chan Min Lee, Hwaseong-si (KR); Eunju Cho, Yecheon-gun (KR); Hui-Jung Kim, Seongnam-si (KR); Joongchan Shin, Seoul (KR); Taehyun An, Seoul (KR); Hyungeun Choi, Suwon-si (KR); Yoosang Hwang, Yongin-si (KR); Kiseok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 16/833,919

(22) Filed: Mar. 30, 2020

(65) Prior Publication Data
US 2021/0057419 A1 Feb. 25, 2021

(30) Foreign Application Priority Data
Aug. 19, 2019 (KR) .................. 10-2019-0101321

(51) Int. Cl.
*H01L 27/108* (2006.01)
(52) U.S. Cl.
CPC .. *H01L 27/10897* (2013.01); *H01L 27/10805* (2013.01)
(58) Field of Classification Search
CPC ......... H01L 27/10897; H01L 27/10805; H01L 27/1085; H01L 27/10894; H01L 27/11521; H01L 27/11551; H01L 27/11568; H01L 27/11578; H01L 27/0688; H01L 27/10844
See application file for complete search history.

(56) References Cited

U.S. PATENT DOCUMENTS

| | | | |
|---|---|---|---|
| 7,402,483 B2 | 7/2008 | Yun et al. |
| 9,041,068 B2 | 5/2015 | Chen |
| 9,514,792 B2 | 12/2016 | Kajigaya |
| 9,806,082 B2 | 10/2017 | Tanaka et al. |
| 9,831,323 B2 | 11/2017 | Kittl et al. |
| 9,853,101 B2 | 12/2017 | Peng et al. |
| 10,008,265 B2 | 6/2018 | Hsu |
| 10,115,438 B2 | 10/2018 | Ingalls et al. |

(Continued)

*Primary Examiner* — David Vu
(74) *Attorney, Agent, or Firm* — Muir Patent Law, PLLC

(57) ABSTRACT

A semiconductor memory device includes a substrate having a cell region and a contact region with a peripheral circuit region, first and second stacks on the cell region, and a first peripheral transistor on the peripheral circuit region. Each of the first and second stacks includes semiconductor patterns stacked, in a vertical direction, on the cell region, bit lines stacked in the vertical direction on the cell region and respectively connected to first ends of the semiconductor patterns, each of the bit lines extending, in a horizontal direction with respect to the upper surface of the substrate, from the cell region to the contact region, and a word line disposed adjacent to the semiconductor patterns and extending in the vertical direction from the cell region of the substrate. The first peripheral transistor is disposed between the bit lines of the first stack and the bit lines of the second stack.

20 Claims, 25 Drawing Sheets

(56) References Cited

U.S. PATENT DOCUMENTS

| | | |
|---|---|---|
| 10,714,495 B2 * | 7/2020 | Jo .................... H01L 23/53295 |
| 2017/0053906 A1 | 2/2017 | Or-Bach et al. |
| 2018/0218765 A1 | 8/2018 | Derner et al. |
| 2018/0323199 A1 | 11/2018 | Roberts et al. |
| 2018/0323200 A1 | 11/2018 | Tang et al. |
| 2019/0103317 A1 | 4/2019 | Yu et al. |

* cited by examiner

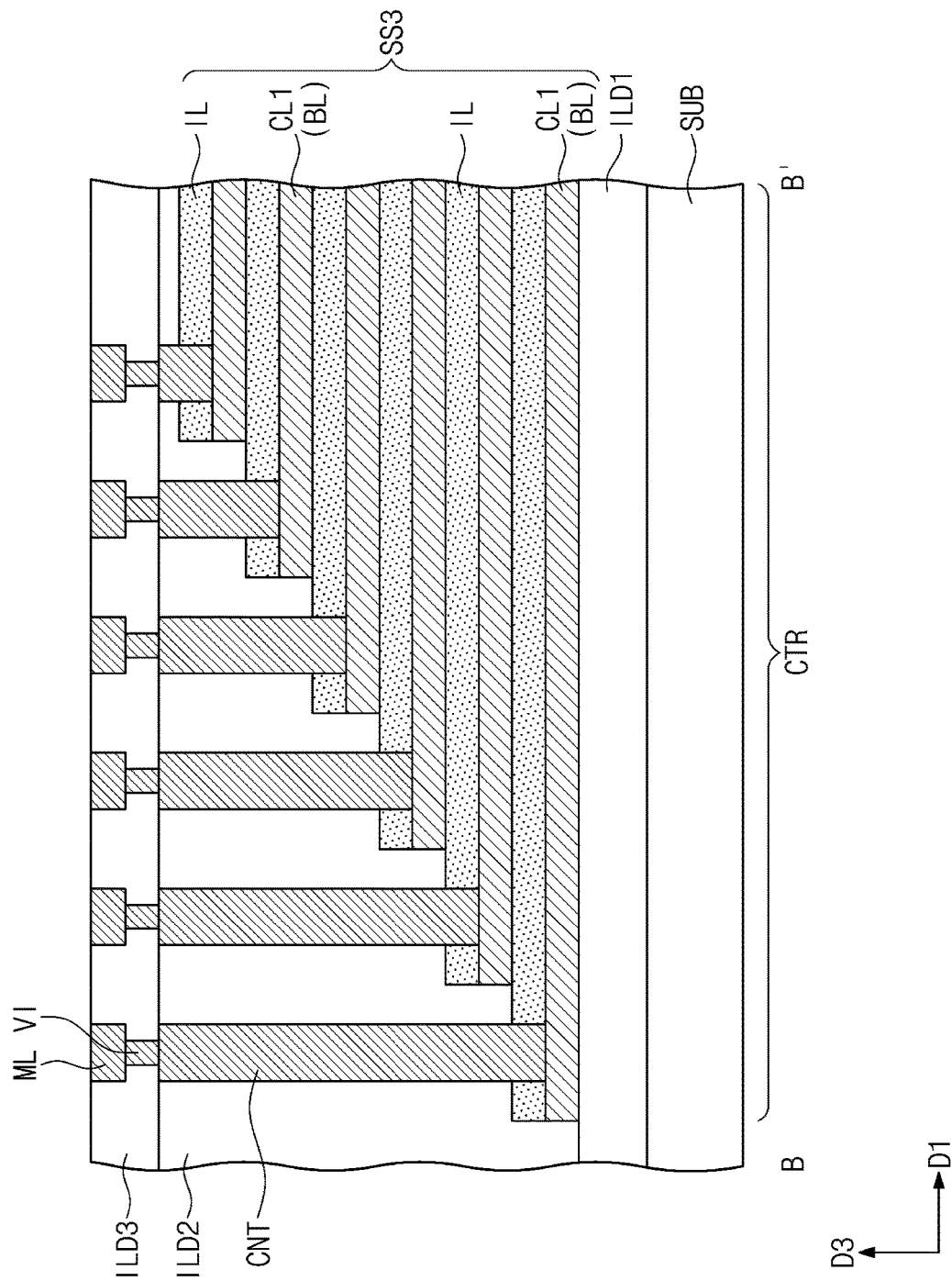

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2019-0101321, filed on Aug. 19, 2019, in the Korean Intellectual Property Office, the entire contents of which are hereby incorporated by reference.

BACKGROUND OF THE INVENTION

The present disclosure relates to a semiconductor memory device, and in particular, to a three-dimensional semiconductor memory device with an increased integration density.

Higher integration of semiconductor devices is desirable for superior performance and inexpensive prices. In the case of semiconductor devices, since their integration is an important factor in determining product prices, increased integration is especially desirable. In the case of two-dimensional or planar semiconductor devices, since their integration is mainly determined by the area occupied by a unit memory cell, integration is greatly influenced by the level of a fine pattern forming technology. However, the extremely expensive process equipment needed to implement the fine patterns sets a practical limitation on increasing integration for two-dimensional or planar semiconductor devices. To overcome such limitations, three-dimensional semiconductor memory devices including three-dimensionally arranged memory cells have recently been proposed.

SUMMARY

An embodiment of the inventive concept provides a three-dimensional semiconductor memory device with an increased integration density.

According to an exemplary embodiment of the present inventive concept, a semiconductor memory device includes a substrate having a cell region and a contact region, the contact region comprising a peripheral circuit region, a first stack and a second stack on the cell region of the substrate, and a first peripheral transistor on the peripheral circuit region. Each of the first and second stacks includes semiconductor patterns stacked, in a vertical direction with respect to an upper surface of the substrate, on the cell region, bit lines stacked in the vertical direction on the cell region and respectively connected to first ends of the semiconductor patterns, each of the bit lines extending, in a horizontal direction with respect to the upper surface of the substrate, from the cell region to the contact region, and a word line disposed adjacent to the semiconductor patterns and extending in the vertical direction from the cell region of the substrate. The first peripheral transistor is disposed between the bit lines of the first stack and the bit lines of the second stack.

According to an exemplary embodiment of the present inventive concept, a semiconductor memory device includes a substrate including a cell region and a peripheral circuit region, a stack on the cell region, and a peripheral transistor on the peripheral circuit region. The stack includes semiconductor patterns stacked, in a vertical direction with respect to an upper surface of the substrate, on the cell region, bit lines stacked in the vertical direction on the cell region and respectively connected to the semiconductor patterns, each of the bit lines extending in a horizontal direction with respect to the upper surface of the substrate, and a word line disposed adjacent to the semiconductor patterns and extending in the vertical direction from the cell region. The peripheral transistor includes active patterns stacked in the vertical direction on the peripheral circuit region, and a peripheral gate electrode disposed adjacent to the active patterns and extending in the vertical direction from the peripheral circuit region.

According to an exemplary embodiment of the present inventive concept, a semiconductor memory device includes a substrate having a cell region and a contact region, a first stack and a second stack on the cell region of the substrate, and a peripheral transistor on the contact region. Each of the first and second stacks includes semiconductor patterns stacked, in a vertical direction with respect to an upper surface of the substrate, on the cell region, bit lines stacked in the vertical direction on the contact region and respectively connected to first ends of the semiconductor patterns, each of the bit lines extending, in a horizontal direction with respect to the upper surface of the substrate, from the cell region to the contact region, and a word line disposed adjacent to the semiconductor patterns and extending in the vertical direction from the cell region. The bit lines have a stepwise structure on the contact region. The peripheral transistor is disposed between the stepwise structure of the first stack and the stepwise structure of the second stack.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 4B is a sectional view taken along line B-B' of FIG. 3.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
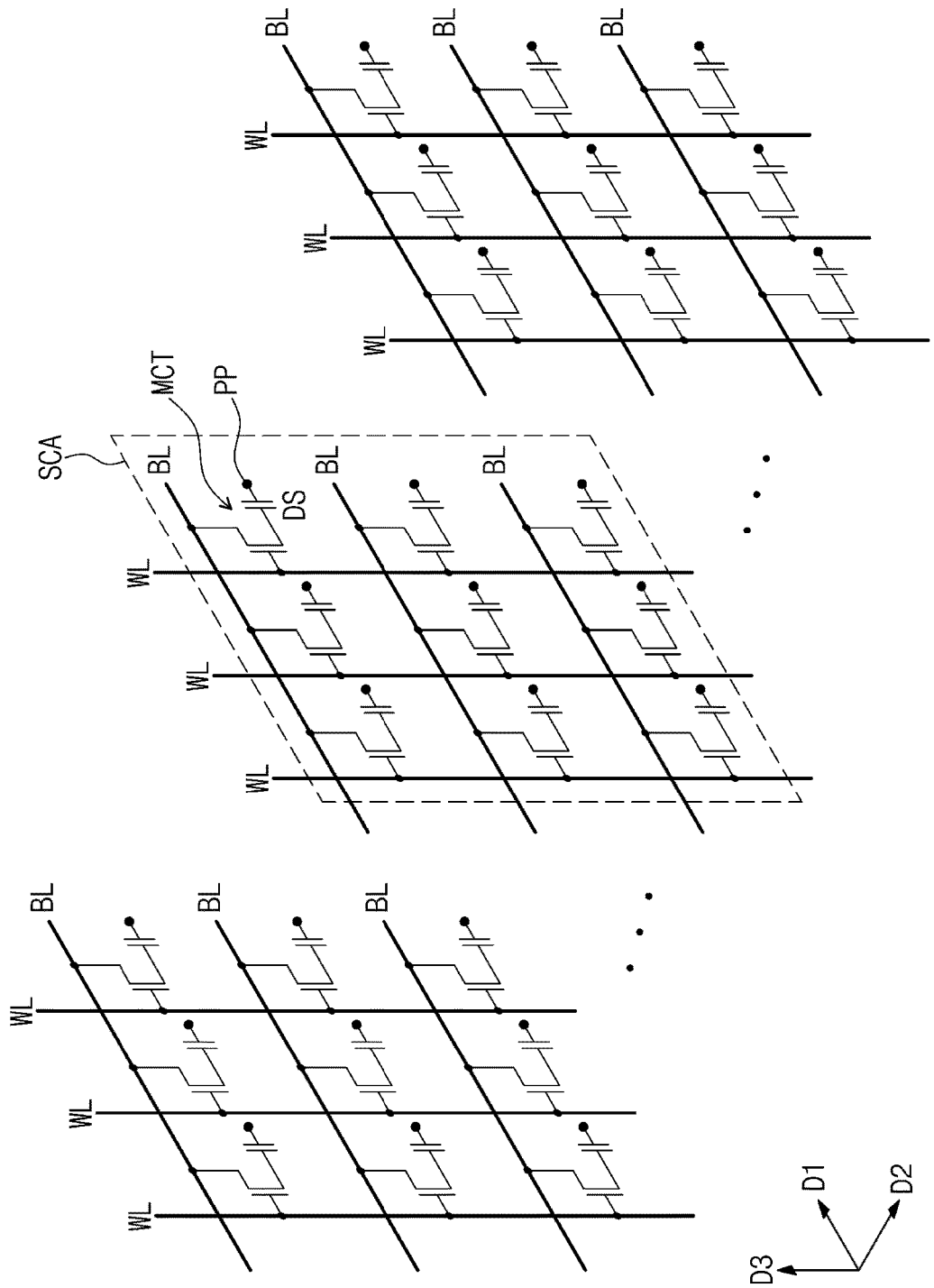
FIG. 1 is a circuit diagram schematically illustrating a cell array of a three-dimensional semiconductor memory device according to an embodiment of the inventive concept.

FIG. 1 is a circuit diagram schematically illustrating a cell array of a three-dimensional semiconductor memory device according to an embodiment of the inventive concept.

Referring to FIG. 1, a cell array of a three-dimensional semiconductor memory device according to an embodiment of the inventive concept may include a plurality of sub-cell arrays SCA. The sub-cell arrays SCA may be arranged in a second direction D2.

Each of the sub-cell arrays SCA may include a plurality of bit lines BL, a plurality of word lines WL, and a plurality of memory cell transistors MCT. Each of the memory cell transistors MCT may be placed between a corresponding one of the word lines WL and a corresponding one of the bit lines BL.

The bit lines BL may be conductive patterns (e.g., metal lines), which are spaced apart from and stacked on a substrate. The bit lines BL may be extended in a first direction D1. The bit lines BL in each of the sub-cell arrays SCA may be spaced apart from each other in a vertical direction (e.g., a third direction D3).

The word lines WL may be conductive patterns (e.g., metal line) extending from the substrate in the vertical direction (e.g., in the third direction D3). The word lines WL in each of the sub-cell arrays SCA may be spaced apart from each other in the first direction D1.

A gate electrode of the memory cell transistor MCT may be connected to the word line WL, and a source electrode of the memory cell transistor MCT may be connected to the bit line BL. Each of the memory cell transistors MCT may include a data storing element DS. In an example embodiment, the data storing element DS may be a capacitor (e.g., a dynamic random access memory (DRAM) cell capacitor). For example, the data storing element DS may include a first electrode connected to a drain electrode of the memory cell transistor MCT, a second electrode of the capacitor connected to a ground line PP, and a dielectric layer interposed between the first electrode and the second electrode.

Figure 2:
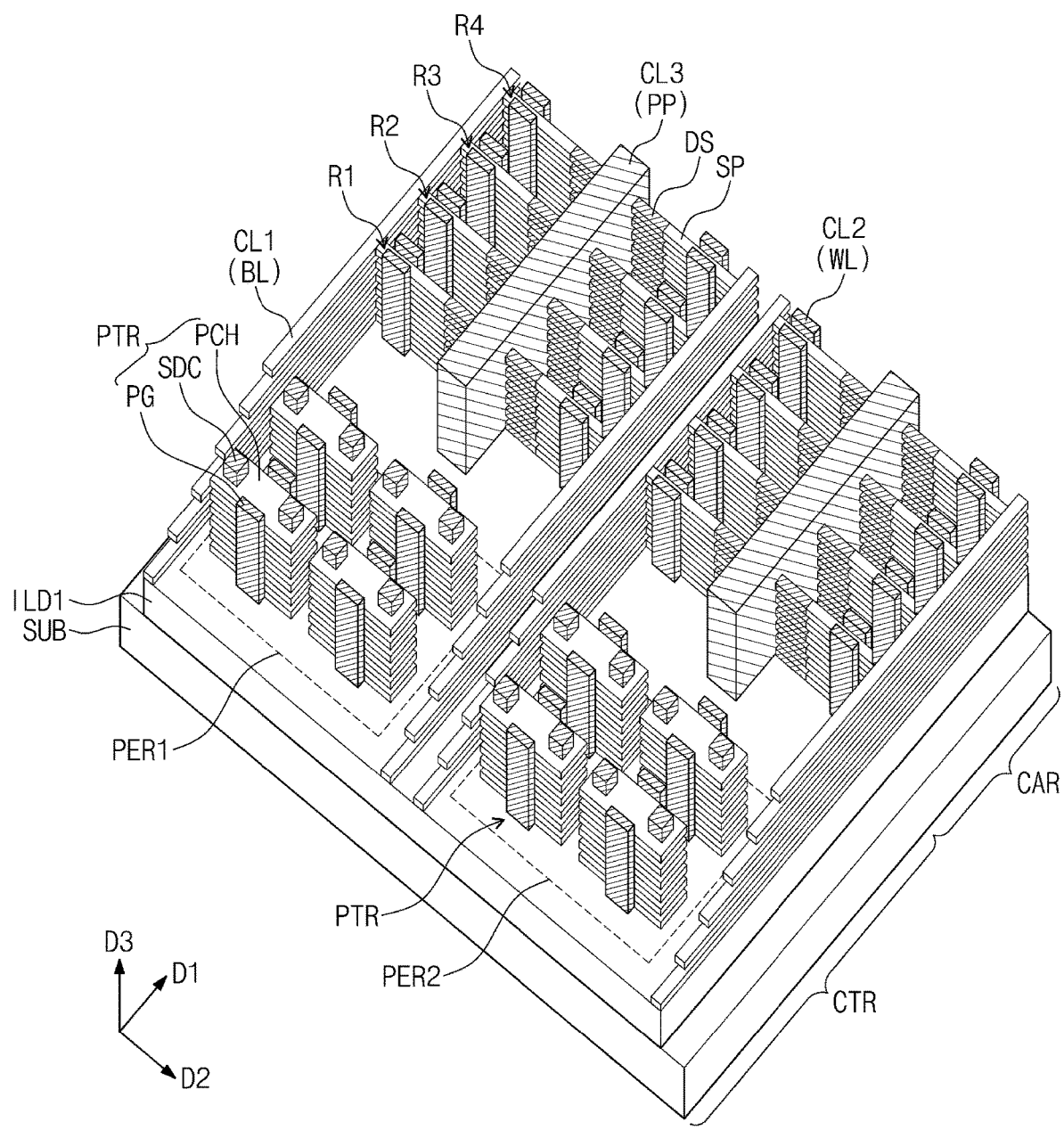
FIG. 2 is a perspective view illustrating a three-dimensional semiconductor memory device according to an embodiment of the inventive concept.
Figure 3:
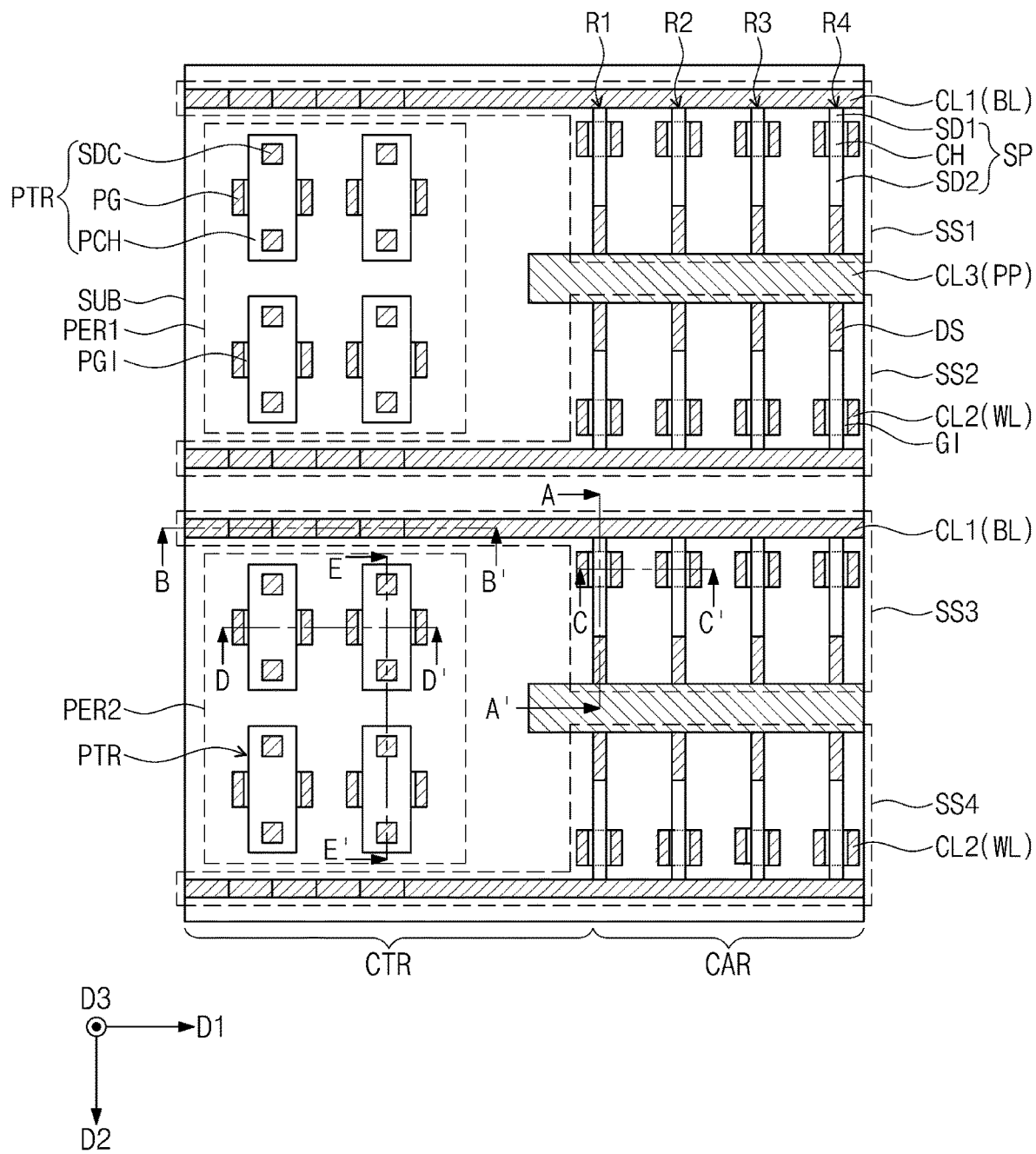
FIG. 3 is a plan view illustrating the semiconductor memory device of FIG. 2.
Figure 4A:
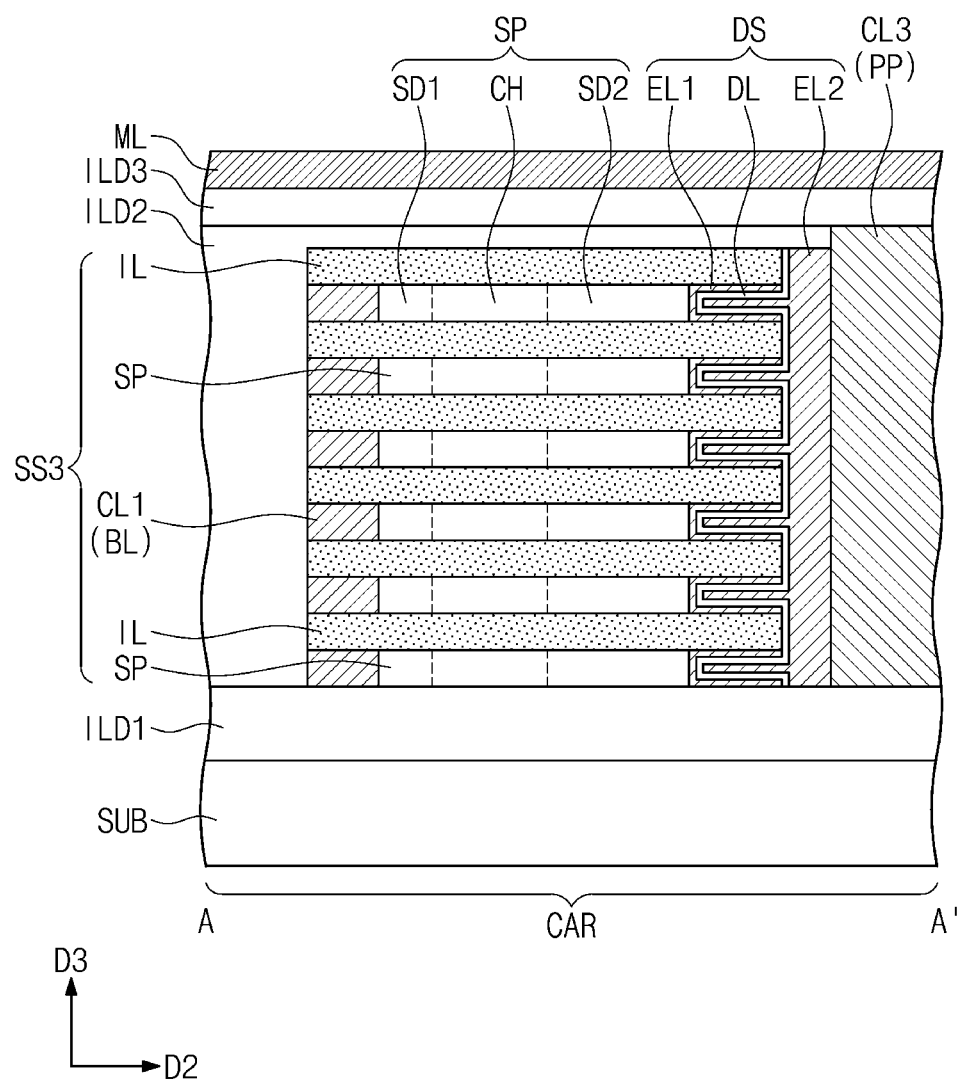
FIG. 4A is a sectional view taken along line A-A' of FIG. 3.
Figure 4C:
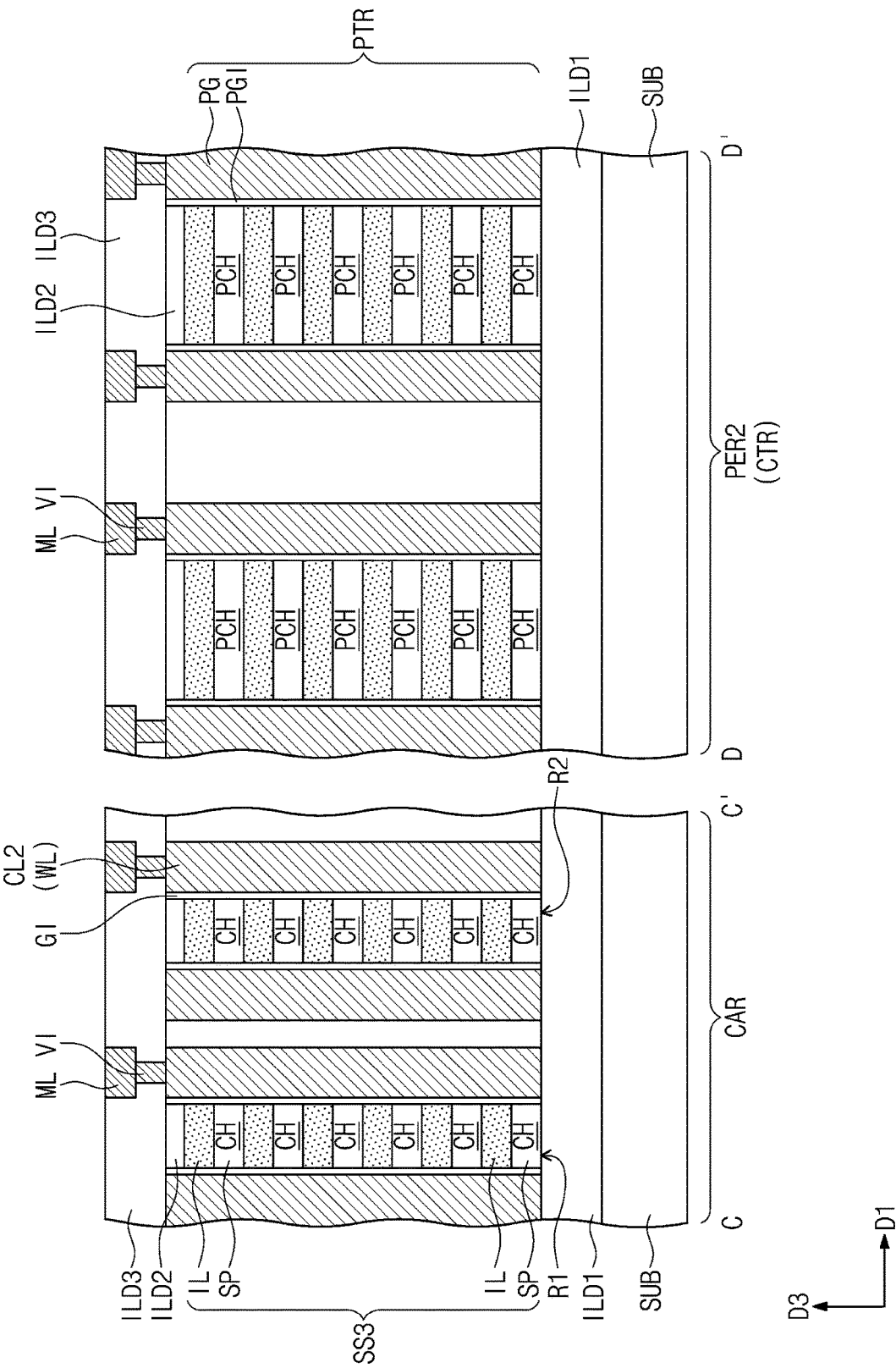
FIG. 4C is a sectional view taken along lines C-C' and D-D' of FIG. 3.
Figure 4D:
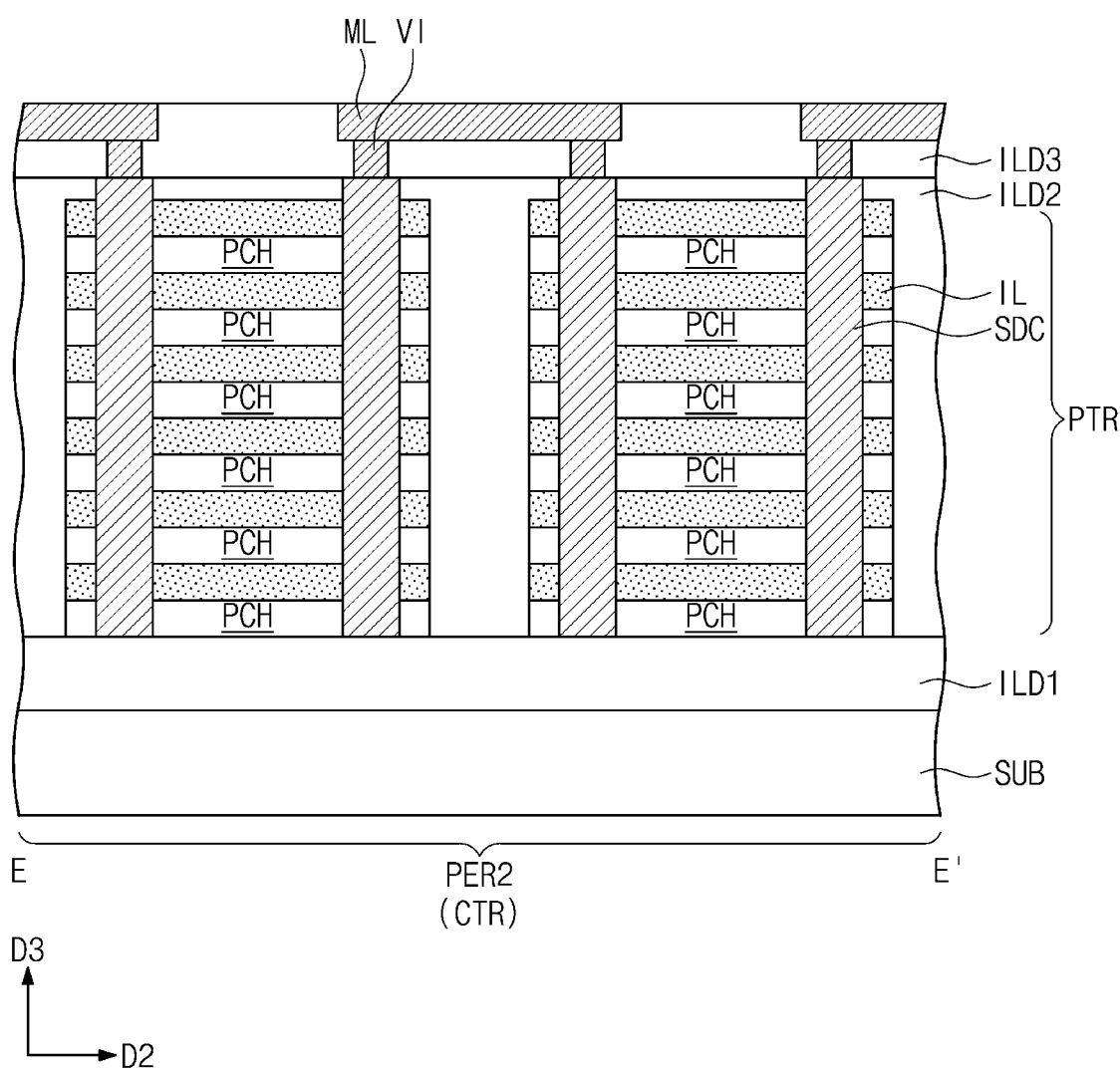
FIG. 4D is a sectional view taken along line E-E' of FIG. 3.

FIG. 2 is a perspective view illustrating a three-dimensional semiconductor memory device according to an embodiment of the inventive concept. FIG. 3 is a plan view illustrating the semiconductor memory device of FIG. 2. FIG. 4A is a sectional view taken along line A-A' of FIG. 3. FIG. 4B is a sectional view taken along line B-B' of FIG. 3. FIG. 4C is a sectional view taken along lines C-C' and D-D' of FIG. 3. FIG. 4D is a sectional view taken along line E-E' of FIG. 3.

Referring to FIGS. 2, 3, and 4A to 4D, a substrate SUB including a cell region CAR and a contact region CTR may be provided. A first interlayered insulating layer ILD1 may be provided on the substrate SUB. The substrate SUB may be a silicon wafer, a germanium wafer, or a silicon-germanium wafer.

First to fourth stacks SS1-SS4 may be provided on the cell region CAR of the substrate SUB (e.g., see FIG. 3). The first to fourth stacks SS1-SS4 may be vertically spaced apart from the substrate SUB with the first interlayered insulating layer ILD1 interposed therebetween. The first to fourth stacks SS1-SS4 may be extended in the first direction D1 and may be parallel to each other. The first to fourth stacks SS1-SS4 may be arranged in the second direction D2. Each of the first to fourth stacks SS1-SS4 may include the sub-cell array SCA previously described with reference to FIG. 1.

Each of the first to fourth stacks SS1-SS4 may include semiconductor patterns SP and insulating layers IL, which are alternately stacked on the cell region CAR. In each of the first to fourth stacks SS1-SS4, the semiconductor patterns SP may be vertically spaced apart from each other by the insulating layers IL. Each of the insulating layers IL may be interposed between a corresponding pair of semiconductor patterns, vertically adjacent to each other, among the semiconductor patterns SP. The insulating layers IL may be formed of or include at least one of silicon oxide, silicon nitride, silicon oxynitride, carbon-containing silicon oxide, carbon-containing silicon nitride, or carbon-containing silicon oxynitride.

Each of the semiconductor patterns SP may be a line-, bar-, or pillar-shaped pattern extending in the second direction D2. In an embodiment, the semiconductor patterns SP may be formed of or include at least one of silicon, germanium, silicon-germanium, or indium gallium zinc oxide (IGZO). In an embodiment, the semiconductor patterns SP may be formed of or include single crystalline silicon. Each of the semiconductor patterns SP may include a first impurity region SD1, a second impurity region SD2, and a channel region CH.

The channel region CH may be provided between the first and second impurity regions SD1 and SD2. The first and second impurity regions SD1 and SD2 may be doped to have a first conductivity type (e.g., an n-type). The channel region CH may be undoped or may be doped to have a second conductivity type (e.g., a p-type) different from the first conductivity type.

The channel region CH may correspond to the channel region of the memory cell transistor MCT of FIG. 1. The first and second impurity regions SD1 and SD2 may correspond to the source and drain electrodes, respectively, of the memory cell transistor MCT of FIG. 1.

The semiconductor patterns SP may be provided on the cell region CAR of the substrate SUB. For example, each of the first to fourth stacks SS1-SS4 may include first to fourth rows R1-R4 of the semiconductor patterns SP. Each of the first to fourth rows R1-R4 may include the semiconductor patterns SP, which are vertically stacked to be overlapped with each other. Although each of the first to fourth rows R1-R4 is illustrated to have six vertically-stacked semiconductor patterns SP, but the inventive concept is not limited to this example. The first to fourth rows R1-R4 may be spaced apart from each other in the first direction D1.

Each of the first to fourth stacks SS1-SS4 may further include first conductive lines CL1, which are vertically stacked on the substrate SUB. In each of the first to fourth stacks SS1-SS4, the first conductive lines CL1 may be vertically spaced apart from each other by the insulating layers IL. Each of the insulating layers IL may be interposed between a corresponding pair of first conductive lines, vertically adjacent to each other, among the first conductive lines CL1.

The first conductive lines CL1 may be provided to have a line- or bar-shaped structure extending in the first direction D1. The first conductive lines CL1 may extend from the cell region CAR of the substrate SUB to the contact region CTR.

The first conductive lines CL1 may be in direct contact with the semiconductor patterns SP, respectively. As an example, each of the first conductive lines CL1 may be positioned at substantially the same level as a corresponding one of the semiconductor patterns SP connected thereto. In an example embodiment, each of the first conductive lines CL1 may be in contact with a first end of a corresponding one of the semiconductor patterns SP. The term "contact," as used herein, refers to a direction connection (i.e., touching) unless the context indicates otherwise. Each of the first conductive lines CL1 may be connected to the first impurity region SD1 of a corresponding one of the semiconductor patterns SP. Each of the semiconductor patterns SP of the first to fourth rows R1-R4, which is positioned at the same level as a corresponding one of the first conductive lines CL1, may extend from the first conductive line CL1 in the second direction D2.

Referring to FIG. 4B, each of the first to fourth stacks SS1-SS4 may have a stepwise structure, on the contact region CTR of the substrate SUB. In other words, the first conductive lines CL1 stacked on the contact region CTR may have a stepwise structure. A length of the first conductive lines CL1 in the first direction D1 may decrease with increasing distance from the top surface of the substrate SUB. For example, the length of the lowermost one of the first conductive lines CL1 may be longer than those of the others. The length of the uppermost one of the first conductive lines CL1 may be shorter than those of the others.

Contacts CNT may be provided on the stepwise structure of the first conductive lines CL1. An end of each of the first conductive lines CL1 may be exposed through the stepwise structure. The contacts CNT may be connected to the first conductive lines CL1, respectively. Each of the contacts CNT may be connected to an exposed end of a corresponding one of the first conductive lines CL1.

The first conductive lines CL1 may be formed of or include a conductive material. For example, the conductive material may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth). The first conductive lines CL1 may be used as the bit lines BL described with reference to FIG. 1.

Each of the first to fourth stacks SS1-SS4 may further include data storing elements DS, which are vertically stacked on the cell region CAR of the substrate SUB. The data storing elements DS, which are stacked on the substrate SUB, may be vertically spaced apart from each other by the insulating layers IL. Each of the data storing elements DS may be extended from the semiconductor pattern SP connected thereto in the second direction D2.

Each of the data storing elements DS may be in direct contact with the semiconductor pattern SP connected thereto. As an example, each of the data storing elements DS may be located at substantially the same level as the semiconductor pattern SP connected thereto. In an example embodiment, each of the data storing elements DS may be in contact with a second end, opposite the first end, of a corresponding one of the semiconductor patterns SP. The data storing element DS may be connected to the second impurity region SD2 of the semiconductor pattern SP.

Referring to FIG. 4A, each of the data storing elements DS may include a first electrode EL1, a dielectric layer DL, and a second electrode EL2. For example, the data storing element DS according to an embodiment of the inventive concept may be a capacitor (e.g., a DRAM cell capacitor).

The first electrode EL1 may be directly connected to the second impurity region SD2 of the semiconductor pattern SP. The first electrode EL1 may have a hollow cylinder shape. The first electrode EL1 may be formed of or include at least one of metallic materials, metal nitrides, or metal silicides. For example, the first electrode EL1 may be formed of or include at least one of refractory metal (e.g., cobalt, titanium, nickel, tungsten, or molybdenum). The first electrode EL1 may be formed of or include at least one of metal nitrides (e.g., titanium nitride, titanium silicon nitride, titanium aluminum nitride, tantalum nitride, tantalum silicon nitride, tantalum aluminum nitride, or tungsten nitride).

The dielectric layer DL may be interposed between the first electrode EL1 and the second electrode EL2. The dielectric layer DL may be provided to directly cover an inner side surface of the first electrode EL1. For example, the dielectric layer DL may be formed of or include at least one of metal oxides (e.g., hafnium oxide, zirconium oxide, aluminum oxide, lanthanum oxide, tantalum oxide, and titanium oxide) or perovskite dielectric materials (e.g., $SrTiO_3$(STO), $(Ba,Sr)TiO_3$(BST), $BaTiO_3$, PZT, and PLZT).

The second electrode EL2 may be provided on the dielectric layer DL. The second electrode EL2 may be provided to fill a cylindrical inner space of the first electrode EL1. The second electrode EL2 may be connected to a third conductive line CL3 to be described below. The second electrode EL2 may be formed of or include at least one of doped silicon, metallic materials, metal nitrides, or metal silicides. As an example, the second electrode EL2 may include substantially the same material as the first electrode EL1.

Second conductive lines CL2 may be provided on the cell region CAR of the substrate SUB to penetrate the first to fourth stacks SS1-SS4. The second conductive lines CL2 may be pillar- or bar-shaped patterns extending in a direction normal to the top surface of the substrate SUB (i.e., in the third direction D3).

For example, referring to FIGS. 3 and 4C, the second conductive lines CL2 penetrating a third stack SS3 may be arranged in the first direction D1. The second conductive lines CL2 penetrating the third stack SS3 may be disposed adjacent to the first to fourth rows R1-R4, respectively, of the third stack SS3. A first pair of second conductive lines among the second conductive lines CL2 penetrating the third stack SS3 may be adjacent to sides surfaces of the semiconductor patterns SP of the first row R1. The first pair of the second conductive lines may be vertically extended, on the sides surfaces of the semiconductor patterns SP of the first row R1. A second pair of second conductive lines among the second conductive lines CL2 penetrating the third stack SS3 may be adjacent to side surfaces of the semiconductor patterns SP of the second row R2. The second pair of the second conductive lines may be vertically extended, on the side surfaces of the semiconductor patterns SP of the second row R2.

Each of the second conductive lines CL2 may be disposed on the channel region CH of a corresponding one of the semiconductor patterns SP. The second conductive lines CL2 may be used as gate electrodes. For example, the second conductive lines CL2 may be used as the gate electrodes of the memory cell transistors MCT of FIG. 1. A gate insulating layer GI may be provided between each of the second conductive lines CL2 and the channel region CH of a corresponding one of the semiconductor patterns SP. The gate insulating layer GI may be a single- or multi-layered structure that is formed of or include at least one of high-k dielectric materials, silicon oxide, silicon nitride, or silicon oxynitride. In an embodiment, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The second conductive lines CL2 may be formed of or include a conductive material, and the conductive material may be one of doped semiconductor materials, conductive metal nitrides, metallic materials, and metal-semiconductor compounds. The second conductive lines CL2 may be used as the word lines WL described with reference to FIG. 1.

The third conductive lines CL3 may be provided on the cell region CAR of the substrate SUB to extend parallel to the first to fourth stacks SS1-SS4 or in the first direction D1. The first one of the third conductive lines CL3 may be provided between the first and second stacks SS1 and SS2, and the second one of the third conductive lines CL3 may be provided between the third and fourth stacks SS3 and SS4.

The third conductive lines CL3 may be electrically connected to the second electrode EL2 of the data storing element DS. The first one of the third conductive line CL3 may be connected in common to the second electrodes EL2 of the first and second stacks SS1 and SS2. The second one of the third conductive line CL3 may be connected in common to the second electrodes EL2 of the third and fourth stacks SS3 and SS4.

The third conductive lines CL3 may be formed of or include a conductive material, and the conductive material may be one of doped semiconductor materials, conductive metal nitrides, metallic materials, and metal-semiconductor compounds. The third conductive lines CL3 may be used as the ground line PP described with reference to FIG. 1.

A second interlayered insulating layer ILD2 may be provided on the first interlayered insulating layer ILD1 to cover the first to fourth stacks SS1-SS4. A third insulating layer ILD3 may be provided on the second interlayered insulating layer ILD2. Each of the first to third interlayered insulating layers ILD1, ILD2, and ILD3 may include at least one of a silicon oxide layer, a silicon nitride layer, or a silicon oxynitride layer.

In an embodiment, the first and second stacks SS1 and SS2 may have substantially the same structure as the third and fourth stacks SS3 and SS4. The first and second stacks SS1 and SS2 and the third and fourth stacks SS3 and SS4 may be provided to be symmetric to each other. The first and second stacks SS1 and SS2 may be provided to have a mirror symmetry about the third conductive line CL3. The third and fourth stacks SS3 and SS4 may be provided to have a mirror symmetry about the third conductive line CL3. The second and third stacks SS2 and SS3 may be provided to have a mirror symmetry about the second interlayered insulating layer ILD2 interposed therebetween.

The contact region CTR of the substrate SUB may include a first peripheral circuit region PER1 and a second peripheral circuit region PER2. When viewed in a plan view, the first peripheral circuit region PER1 may be provided between the stepwise structure of the first stack SS1 and the stepwise structure of the second stack SS2. When viewed in a plan view, the second peripheral circuit region PER2 may be provided between the stepwise structure of the third stack SS3 and the stepwise structure of the fourth stack SS4.

The first and second peripheral circuit regions PER1 and PER2 may include peripheral transistors PTR, resistors, and capacitors, which are electrically connected to the memory cell arrays. As an example, the first and second peripheral circuit regions PER1 and PER2 may include sense amplifiers connected to the first conductive lines CL1 (i.e., the bit lines) of the cell region CAR.

Hereinafter, the peripheral transistors PTR on the first and second peripheral circuit regions PER1 and PER2 will be described in more detail with reference to FIGS. 2, 3, 4C, and 4D.

The peripheral transistor PTR may include active patterns PCH and insulating layers IL, which are alternately stacked on the first or second peripheral circuit region PER1 or PER2. The stacked active patterns PCH may be vertically spaced apart from each other by the insulating layers IL.

Referring to FIG. 4C, each of the stacked active patterns PCH may be disposed at the same level as a corresponding one of the semiconductor patterns SP stacked on the cell region CAR. The stacked active patterns PCH may be formed of or include the same material as the stacked semiconductor patterns SP. For example, each of the semiconductor patterns SP and a corresponding one of the active patterns PCH may be disposed at the same level and may be formed simultaneously from a single semiconductor layer.

The peripheral transistor PTR may further include a pair of peripheral gate electrodes PG. The peripheral gate electrode PG may be a pillar- or bar-shaped pattern extending in the third direction D3. For example, the peripheral gate electrode PG may be formed of or include the same material as the second conductive line CL2. In an embodiment, the peripheral gate electrode PG and the second conductive line CL2 may be formed simultaneously.

A pair of the peripheral gate electrodes PG may be respectively provided at opposite sides of each of the active patterns PCH. A peripheral gate insulating layer PGI may be interposed between the peripheral gate electrode PG and each of the active patterns PCH. For example, the peripheral gate insulating layer PGI may be formed of or include the same material as the gate insulating layer GI.

The peripheral transistor PTR may further include a pair of source/drain contacts SDC penetrating the stacked active patterns PCH. The pair of the source/drain contacts SDC may serve as the source and drain electrodes, respectively, of the peripheral transistor PTR. When the peripheral transistor PTR is in an on state, carriers may move from one source/drain contacts SDC to another source/drain contact SDC through the active patterns PCH.

The stacked active patterns PCH of the peripheral transistor PTR may be used as channel regions of the peripheral transistor PTR. In other words, the peripheral transistor PTR according to the present embodiment may be a multi bridge channel field effect transistor (MBCFET). In more detail, the peripheral transistor PTR according to the present embodiment may be a double gate MBCFET including a pair of the peripheral gate electrodes PG, which are respectively provided at opposite sides of each of the active patterns PCH.

Meanwhile, although not shown, the substrate SUB may further include a third peripheral circuit region. The third peripheral circuit region may include row decoders and/or sub-word line drivers, which are connected to the second conductive lines CL2 (i.e., the word lines) of the cell region CAR. The peripheral transistor PTR described above may be provided on the third peripheral circuit region.

Referring back to FIGS. 2, 3, and 4A to 4D, a plurality of interconnection lines ML may be provided in the third interlayered insulating layer ILD3. The interconnection lines ML may be formed of or include at least one of metal materials (e.g., aluminum, copper, tungsten, molybdenum, or cobalt).

Some of the interconnection lines ML may be electrically connected to the first conductive line CL1 through a via VI and the contact CNT (e.g., see FIG. 4B). Some of the interconnection lines ML may be electrically connected to the second conductive line CL2 through the via VI. (e.g., see FIG. 4C). Some of the interconnection lines ML may be electrically connected to the peripheral gate electrode PG through the via VI (e.g., see FIG. 4C). Some of the interconnection lines ML may be electrically connected to the source/drain contact SDC through the via VI (e.g., see FIG. 4D).

Although not shown, the interconnection lines ML may be composed of a plurality of stacked metal layers. In an embodiment, the first conductive lines CL1 on the cell region CAR may be electrically connected to the peripheral transistors PTR on the first and second peripheral circuit regions PER1 and PER2 through the interconnection lines ML.

FIGS. 5 to 8 are sectional views, which are taken along lines C-C' and D-D' of FIG. 3 to illustrate a method of fabricating a three-dimensional semiconductor memory device, according to an embodiment of the inventive concept.

Figure 5:
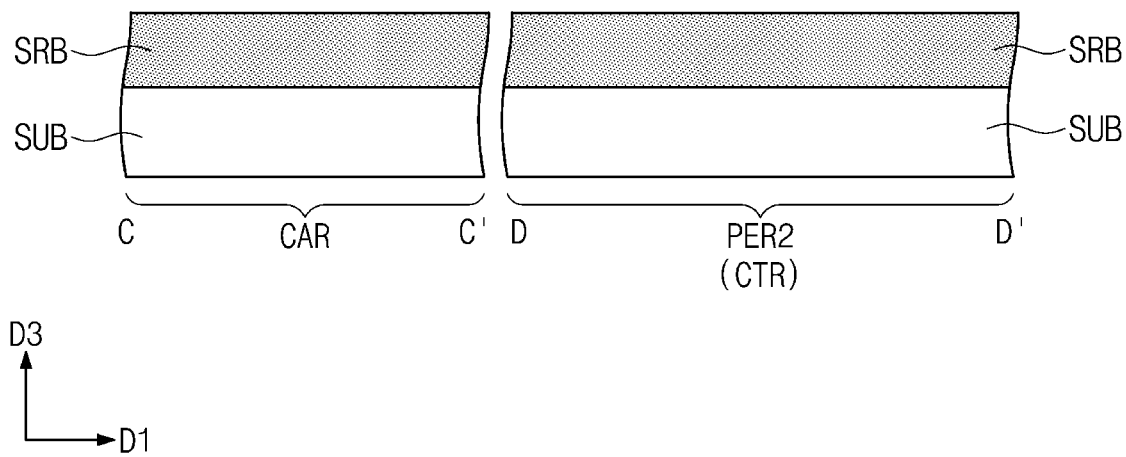
FIGS. 5 to 8 are sectional views, which are taken along lines C-C' and D-D' of FIG. 3, to illustrate a method of fabricating a three-dimensional semiconductor memory device, according to an embodiment of the inventive concept.

Referring to FIGS. 3 and 5, a buffer layer SRB may be formed on the entire top surface of the substrate SUB. The buffer layer SRB may be formed on the cell region CAR and the contact region CTR including the first and second peripheral circuit regions PER1 and PER2.

For example, the substrate SUB may be a single crystalline silicon wafer. The buffer layer SRB may be formed of or include silicon-germanium (SiGe). A concentration of germanium in the buffer layer SRB may range from 10 at % to 20 at %. The buffer layer SRB may be formed by a selective epitaxial growth process. The buffer layer SRB may be grown along a crystal structure of the substrate SUB.

For example, the buffer layer SRB may have the same crystal structure as that of the substrate SUB (i.e., the single crystalline structure). The buffer layer SRB may be formed to have a thickness ranging from 200 nm to 1000 nm.

Before the formation of the buffer layer SRB, a cleaning process may be performed on the substrate SUB. The cleaning process may include a wet etching process using HF, a dry etching process using NF3, or a combination thereof.

Figure 6:
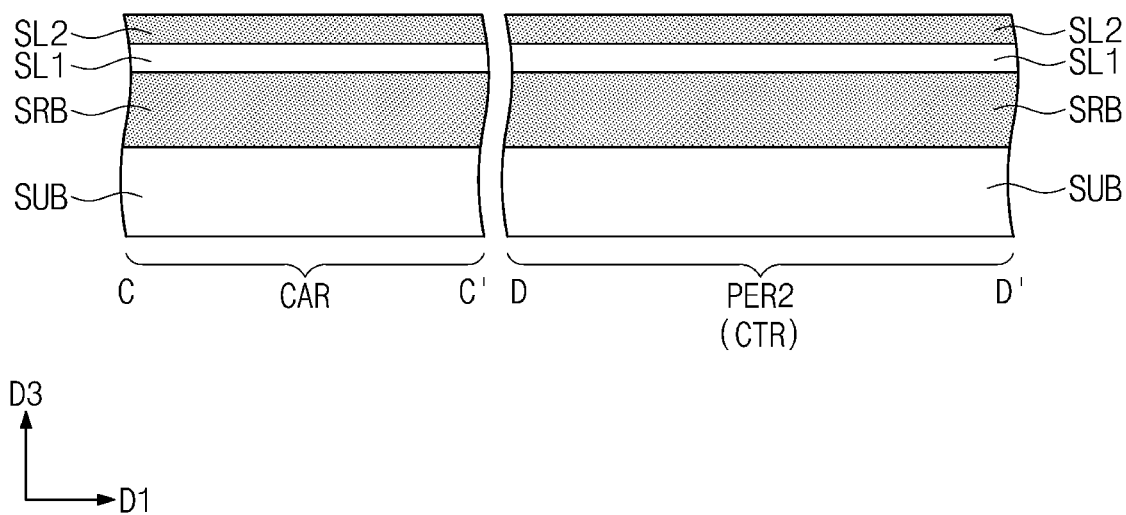

Referring to FIGS. 3 and 6, a first semiconductor layer SL1 may be formed on the buffer layer SRB. The first semiconductor layer SL1 may be formed of or include silicon (Si). The first semiconductor layer SL1 may be formed by a selective epitaxial growth process. The first semiconductor layer SL1 may be grown along the crystal structure of the buffer layer SRB. Thus, the first semiconductor layer SL1 may include single-crystalline silicon (Si).

The buffer layer SRB may prevent crystal defects from being formed in the first semiconductor layer SL1. The buffer layer SRB may be formed on the substrate SUB in a manner of gradually reducing lattice mismatch therebetween so that threading dislocation density is reduced in the buffer layer SRB. The buffer layer SRB may be used as a buffer alleviating a stress caused by a difference in lattice structure between the substrate SUB and the buffer layer SRB.

During the formation of the first semiconductor layer SL1, the first semiconductor layer SL1 may be doped with impurities in an in-situ manner. For example, the first semiconductor layer SL1 may be doped with boron (B) atoms with a concentration of $1E17/cm^3$ to $1E18/cm^3$.

A second semiconductor layer SL2 may be formed on the first semiconductor layer SL1. The second semiconductor layer SL2 may be formed of or include silicon-germanium (SiGe). A concentration of germanium in the second semiconductor layer SL2 may range from 15 at % to 35 at %. The concentration of germanium in the second semiconductor layer SL2 may be higher than the concentration of germanium in the buffer layer SRB.

The second semiconductor layer SL2 may be formed by a selective epitaxial growth process. The second semiconductor layer SL2 may be grown along the crystal structure of the first semiconductor layer SL1. The second semiconductor layer SL2 may be formed to have a thickness ranging from 10 nm to 30 nm.

Figure 7:
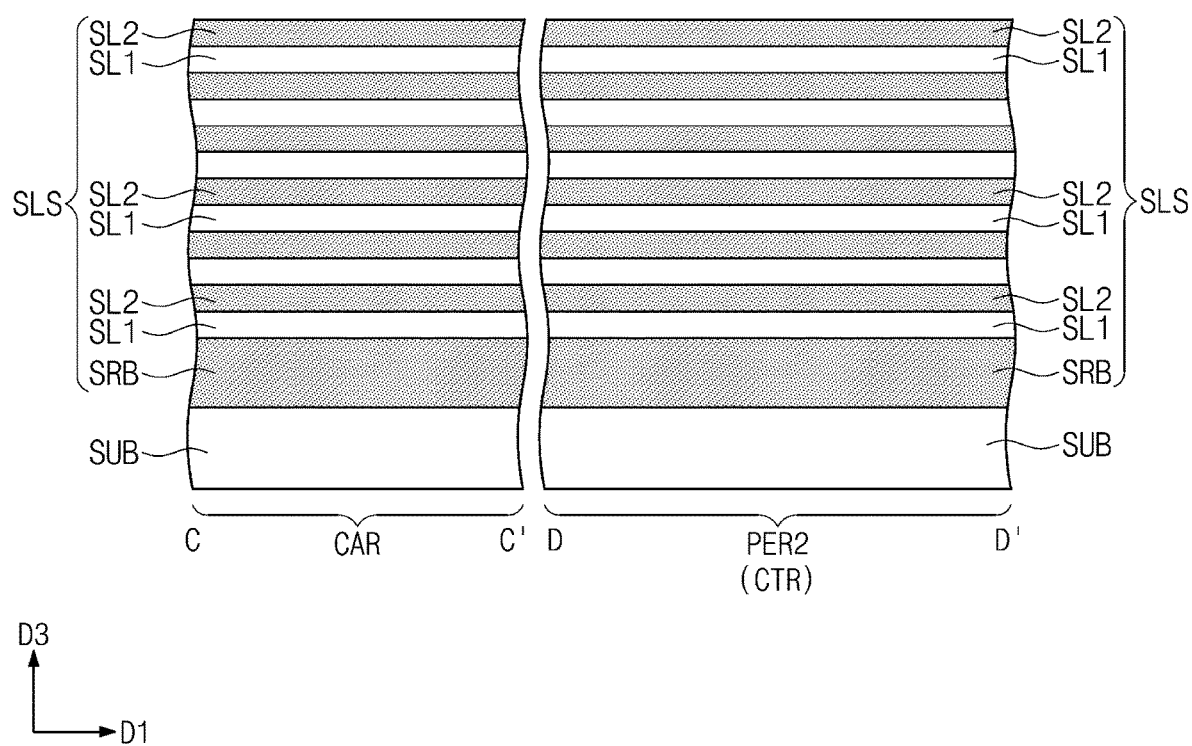

Referring to FIGS. 3 and 7, a cycle process of forming the first semiconductor layer SL1 and the second semiconductor layer SL2 may be performed several times to form a semiconductor stack SLS. The semiconductor stack SLS may include the buffer layer SRB on the substrate SUB and the first and second semiconductor layers SL1 and SL2, which are alternately stacked on the buffer layer SRB. All of the processes of forming the semiconductor stack SLS may be performed in situ in a single chamber. The first semiconductor layers SL1 in the semiconductor stack SLS may include single crystalline silicon (Si).

Figure 8:
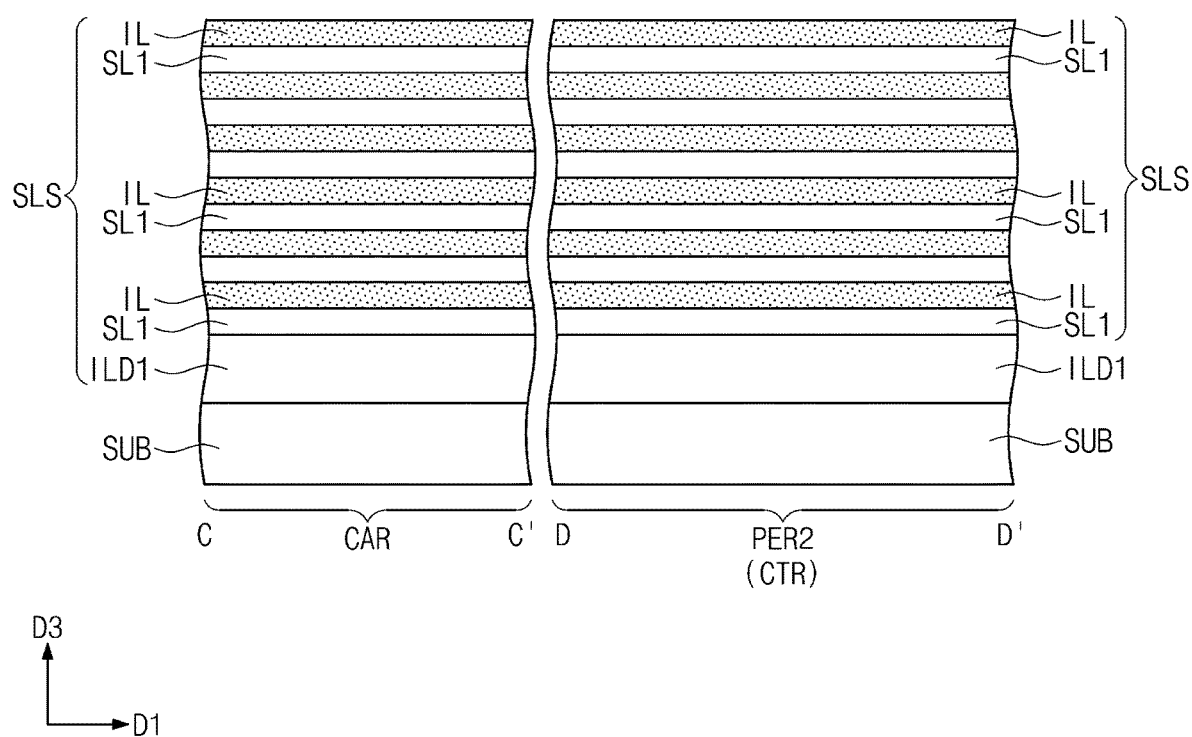

Referring to FIGS. 3 and 8, the second semiconductor layers SL2 of the semiconductor stack SLS may be replaced with the insulating layers IL. For example, the second semiconductor layers SL2 may be selectively etched to leave the first semiconductor layers SL1. The insulating layers IL may be formed between the first semiconductor layers SL1. The buffer layer SRB of the semiconductor stack SLS may be replaced with the first interlayered insulating layer ILD1.

Thereafter, as previously described with reference to FIGS. 2, 3, and 4A to 4D, the first to fourth stacks SS1-SS4 may be formed from the semiconductor stack SLS on the cell region CAR and the contact region CTR. For example, the semiconductor patterns SP may be formed from the first semiconductor layers SL1 on the cell region CAR.

The peripheral transistors PTR may be formed from the semiconductor stack SLS on the first and second peripheral circuit regions PER1 and PER2. For example, the active patterns PCH may be formed from the first semiconductor layers SL1 on the first and second peripheral circuit regions PER1 and PER2.

Figure 9:
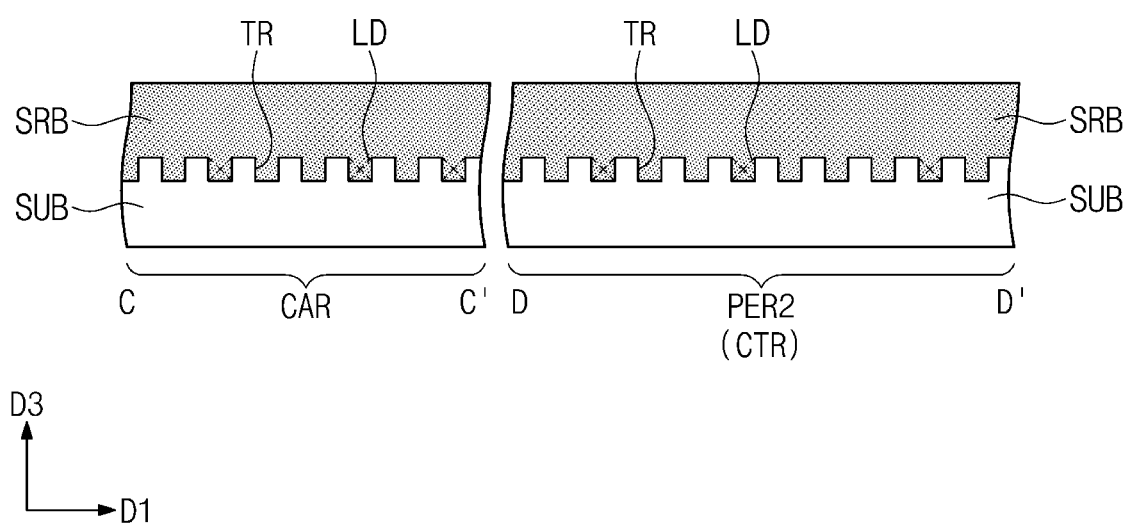
FIG. 9 is a sectional view taken along lines C-C' and D-D' of FIG. 3 to illustrate a method of fabricating a three-dimensional semiconductor memory device according to another embodiment of the inventive concept.

FIG. 9 is a sectional view taken along lines C-C' and D-D' of FIG. 3 to illustrate a method of fabricating a three-dimensional semiconductor memory device according to another embodiment of the inventive concept. Referring to FIGS. 3 and 9, trenches TR may be formed on the substrate SUB. The buffer layer SRB may be formed on the entire top surface of the substrate SUB. The buffer layer SRB may cover the trenches TR. In an example embodiment, the buffer layer SRB may fill the trenches TR.

When the buffer layer SRB is formed, a lattice defect LD may be produced, due to a difference in lattice structure between the substrate SUB and the buffer layer SRB. For example, the lattice defect LD may be formed a portion of the buffer layer SRB in the trench TR, but the lattice defect LD may not be produced in the other portion of the buffer layer SRB, which is disposed at a higher level than the trench TR. In other words, it may be possible to more efficiently relieve a stress between the substrate SUB and the buffer layer SRB through the trenches TR.

Hereinafter, various embodiments of the inventive concept will be described below. In the following description, an element previously described with reference to FIGS. 2, 3, and 4A to 4D may be identified by the same reference number without repeating an overlapping description thereof, and an element or features, which was not described with reference to FIGS. 2, 3, and 4A to 4D, will be described in more detail.

Figure 10:
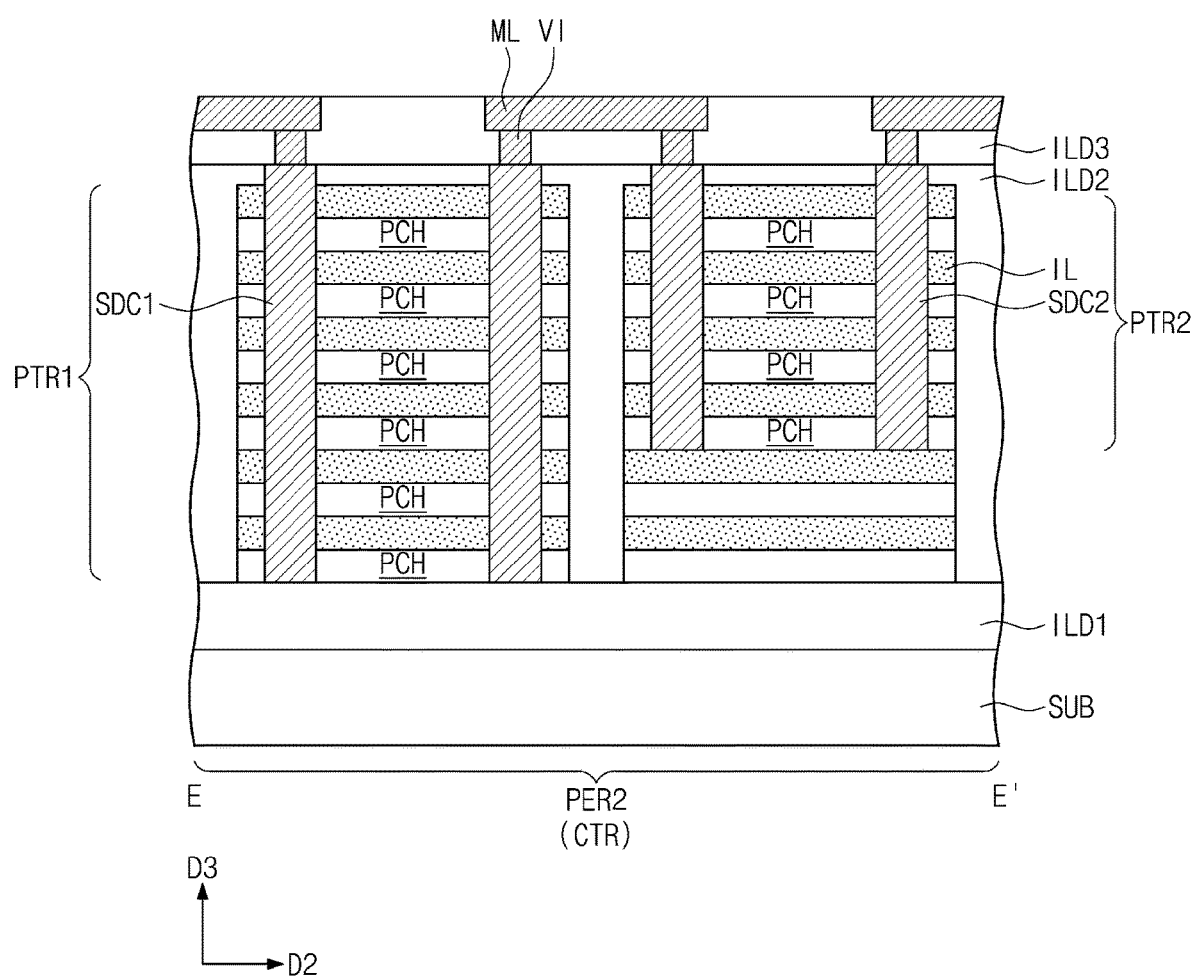
FIG. 10 is a sectional view taken along line E-E' of FIG. 3.

FIG. 10 is a sectional view taken along line E-E' of FIG. 3. Referring to FIGS. 3 and 10, the peripheral transistors PTR may include a first peripheral transistor PTR1 and a second peripheral transistor PTR2, which are adjacent to each other in the second direction D2. The first peripheral transistor PTR1 may include a pair of first source/drain contacts SDC1, and the second peripheral transistor PTR2 may include a pair of second source/drain contacts SDC2.

The first source/drain contacts SDC1 may have bottom surfaces, which are positioned at a different level from those of the second source/drain contacts SDC2. For example, the bottom surfaces of the first source/drain contacts SDC1 may be lower than the bottom surfaces of the second source/drain contacts SDC2. Thus, the number of the active patterns PCH connected to the first source/drain contacts SDC1 may be greater than the number of the active patterns PCH connected to the second source/drain contacts SDC2.

Since the active patterns PCH connected to the first source/drain contacts SDC1 are more than the active patterns PCH connected to the second source/drain contacts SDC2, the number of the active patterns PCH, which are used as the channel region in the first peripheral transistor PTR1 may be greater than the number of the active patterns PCH, which are used as the channel region in the second peripheral transistor PTR2. In other words, a size (e.g., a channel width) of the channel region of the first peripheral transistor PTR1 may be greater than a size (e.g., a channel width) of the channel region of the second peripheral transistor PTR2.

That is, according to the present embodiments, by adjusting a depth of the source/drain contact SDC in the peripheral transistor PTR, it may be possible to control the channel size (e.g., the channel width) of the peripheral transistor PTR. Accordingly, it may be possible to easily realize the peripheral transistors PTR with various channel widths.

Figure 11:
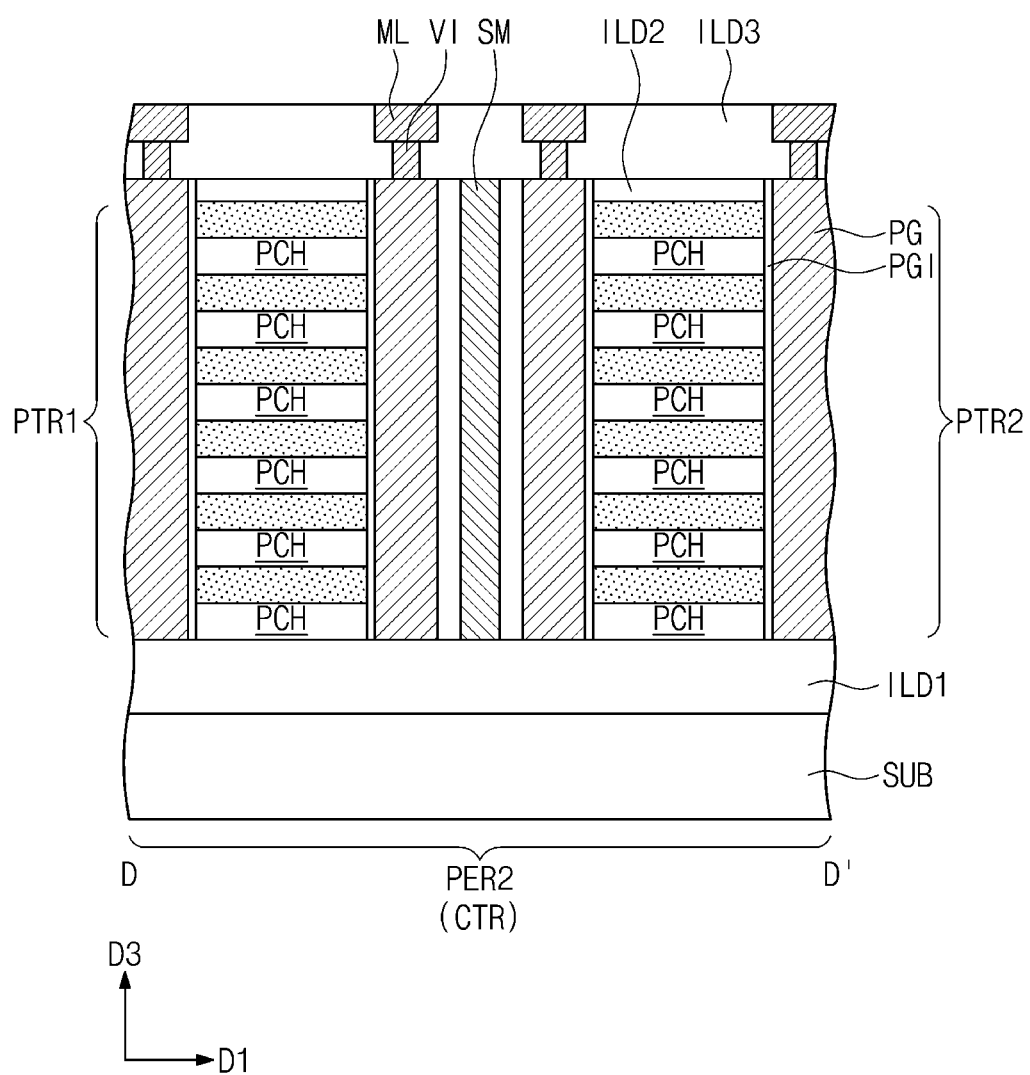
FIG. 11 is a sectional view taken along line D-D' of FIG. 3.

FIG. 11 is a sectional view taken along line D-D' of FIG. 3. Referring to FIGS. 3 and 11, the peripheral transistors PTR may include the first peripheral transistor PTR1 and the second peripheral transistor PTR2, which are adjacent to each other in the first direction D1. A shielding line SM may be provided between the first peripheral transistor PTR1 and the second peripheral transistor PTR2. In detail, the shielding line SM may be interposed between the peripheral gate electrode PG of the first peripheral transistor PTR1 and the peripheral gate electrode PG of the second peripheral transistor PTR2. The shielding line SM may be a line- or pillar-shaped pattern extending in the third direction D3.

The second interlayered insulating layer ILD2 may be interposed between the shielding line SM and the peripheral gate electrodes PG, and thus, the shielding line SM may be spaced apart from the peripheral gate electrodes PG. The shielding line SM may reduce a coupling capacitance, which results from interference between the peripheral gate electrodes PG of the first and second peripheral transistors PTR1 and PTR2. As an example, the shielding line SM may be connected to a node, to which a ground voltage is applied.

Figure 12:
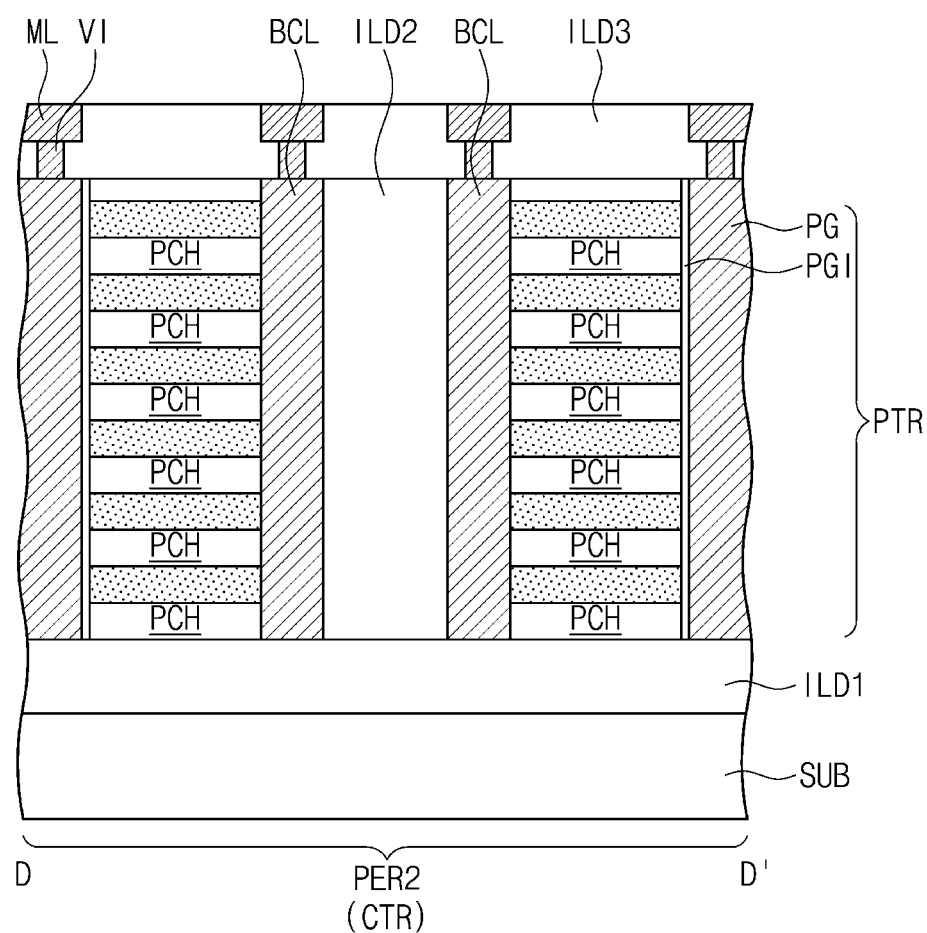
FIG. 12 is a sectional view taken along line D-D' of FIG. 3.

FIG. 12 is a sectional view taken along line D-D' of FIG. 3. Referring to FIGS. 3 and 12, the peripheral transistor PTR may include the peripheral gate electrode PG, which is adjacent to one side of each of the active patterns PCH, and a body contact line BCL, which is adjacent to an opposite side of each of the active patterns PCH. The body contact line BCL may be in contact with each of the stacked active patterns PCH. As shown, no insulating layer is interposed between the body contact line BCL and the stacked active patterns PCH.

The body contact line BCL may be in contact with each of the stacked active patterns PCH and thus may serve as a body contact. The body contact line BCL may prevent a floating body effect from occurring in the peripheral transistor PTR.

Figure 13A:
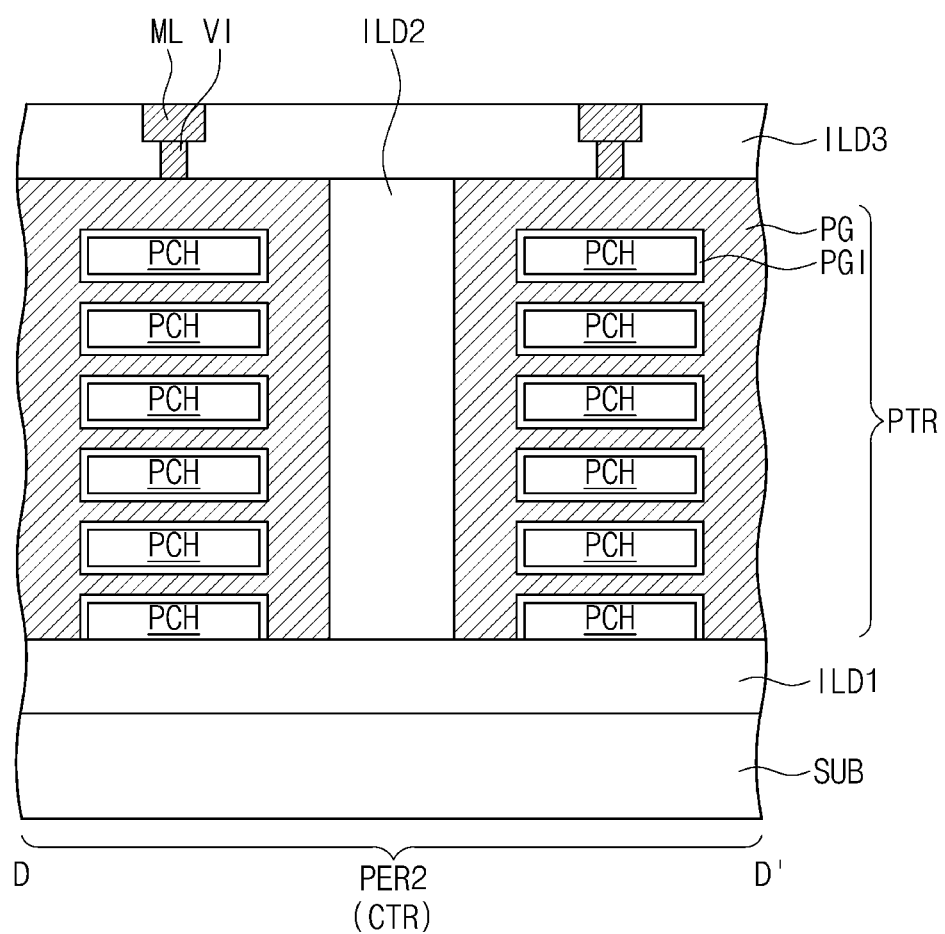
FIG. 13A is a sectional view taken along line D-D' of FIG. 3.
Figure 13B:
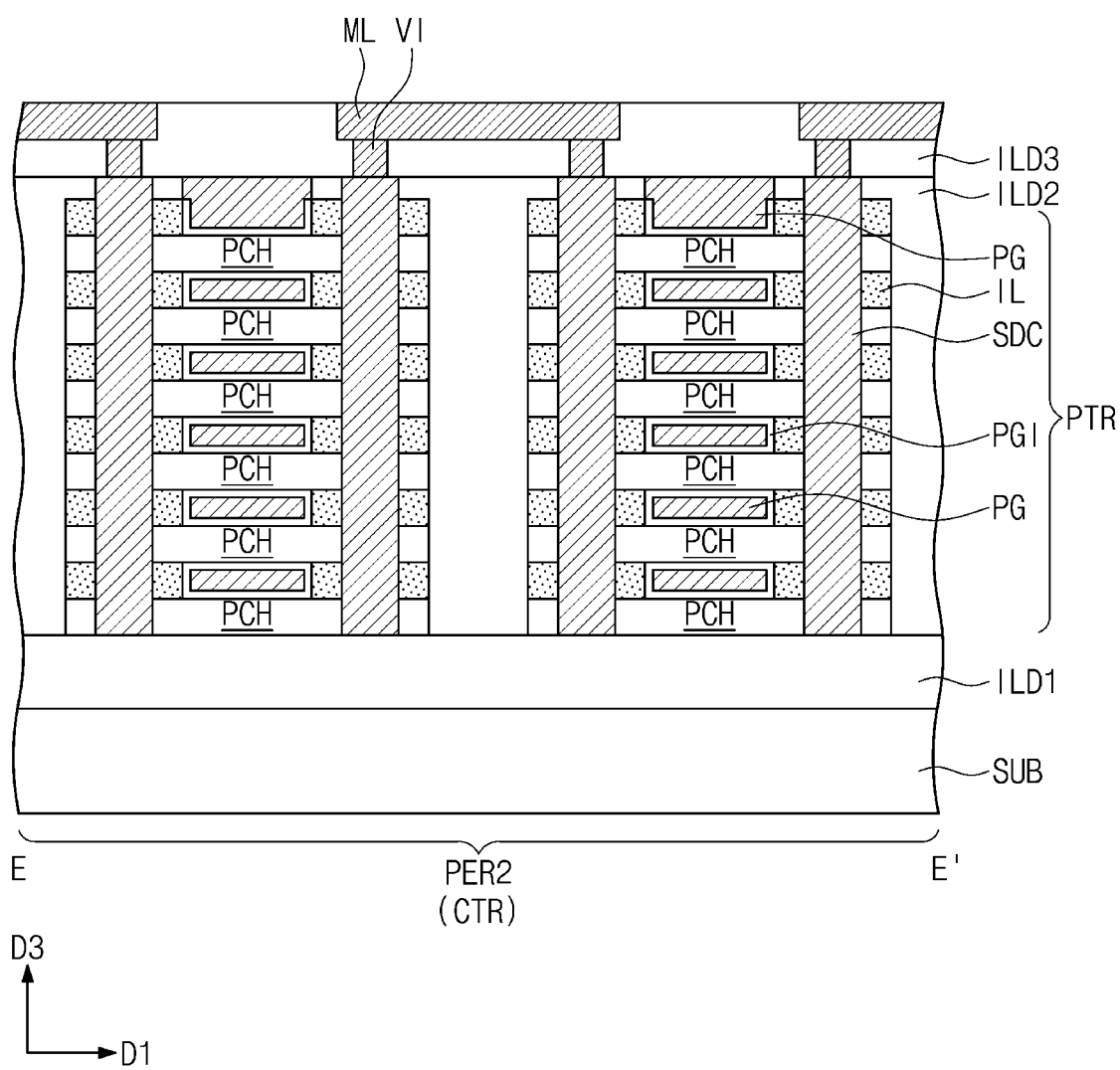
FIG. 13B is a sectional view taken along line E-E' of FIG. 3.
Figure 13C:
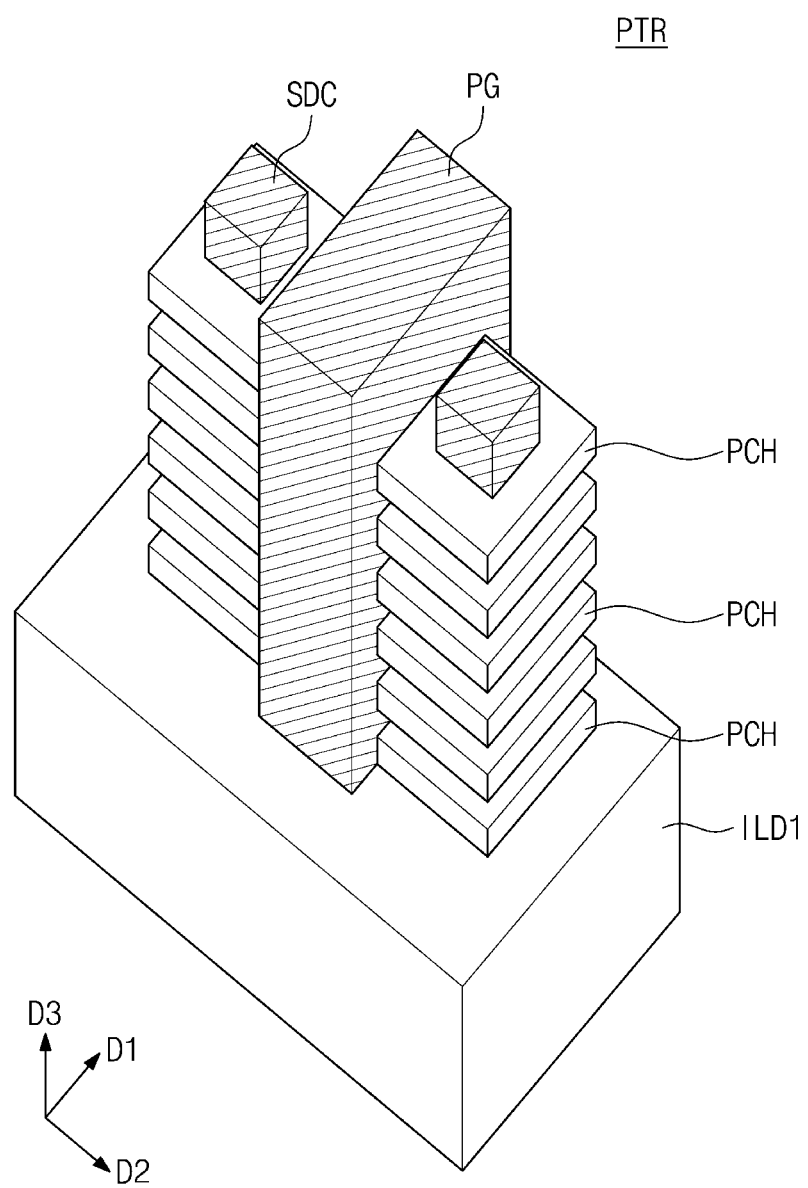
FIG. 13C is a perspective view illustrating a peripheral transistor according to an embodiment of the inventive concept.

FIG. 13A is a sectional view taken along line D-D' of FIG. 3. FIG. 13B is a sectional view taken along line E-E' of FIG. 3. FIG. 13C is a perspective view illustrating a peripheral transistor according to an embodiment of the inventive concept. Referring to FIGS. 3, 13A, 13B, and 13C, the peripheral transistor PTR according to the present embodiment may be a gate-all-around field effect transistor (GAAFET).

In detail, the peripheral gate electrode PG of the peripheral transistor PTR may be provided to surround each of the active patterns PCH. For example, the peripheral gate electrode PG may be provided on top, bottom, and opposite side surfaces of each of the active patterns PCH (e.g., see FIG. 13A). The peripheral gate insulating layer PGI may cover the top, bottom, and opposite side surfaces of each of the active patterns PCH, and the peripheral gate electrode PG may be provided on the peripheral gate insulating layer PGI.

Figure 14:
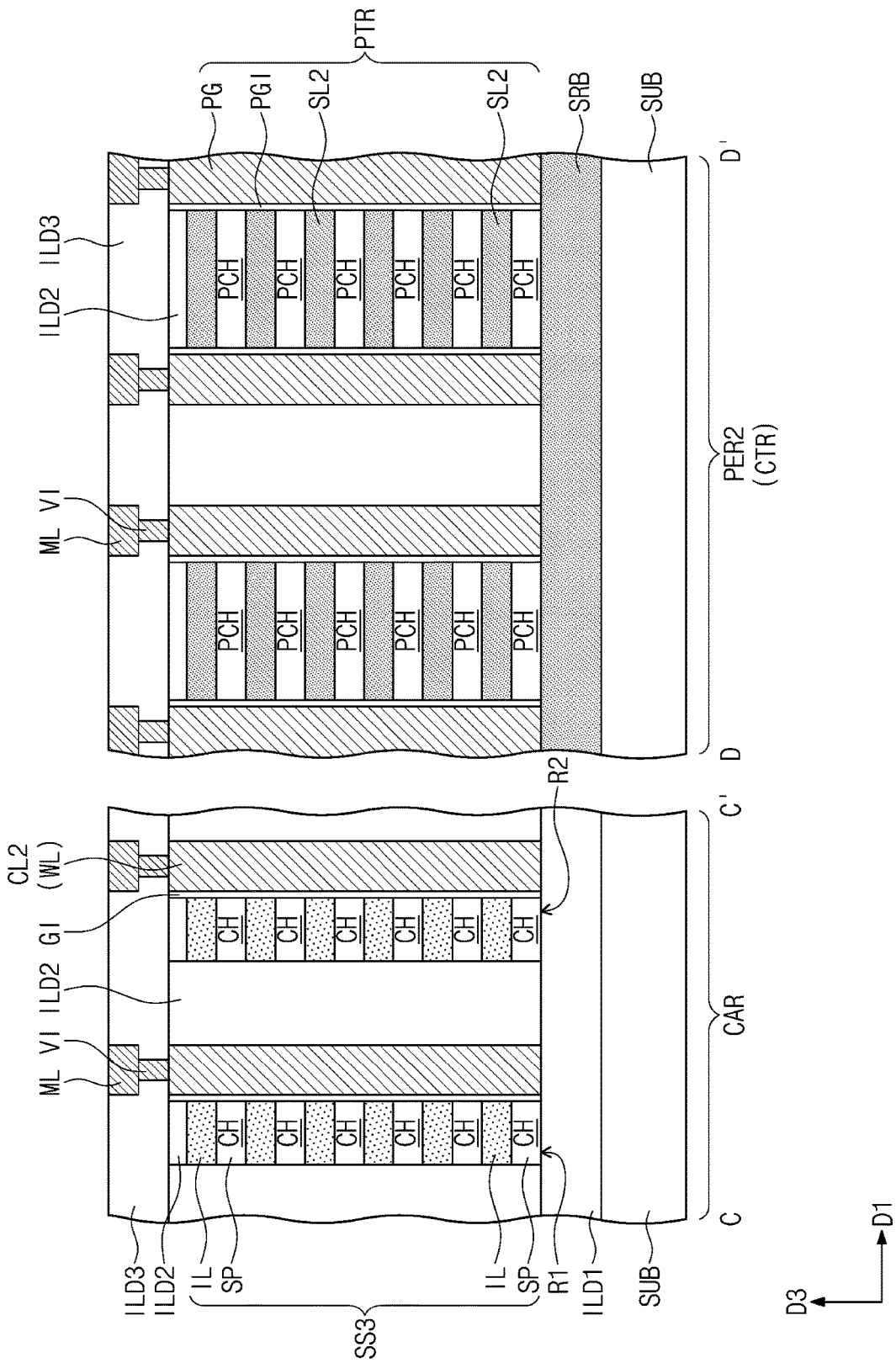
FIG. 14 is a sectional view taken along lines C-C' and D-D' of FIG. 3.

FIG. 14 is a sectional view taken along lines C-C' and D-D' of FIG. 3. Referring to FIGS. 3 and 14, the peripheral transistor PTR may include the active patterns PCH and the second semiconductor layers SL2, which are alternately stacked on the first or second peripheral circuit region PER1 or PER2. Each of the second semiconductor layers SL2 may be formed of or include silicon-germanium (SiGe). A concentration of germanium in the second semiconductor layer SL2 may range from 15 at % to 35 at %.

The buffer layer SRB may be interposed between the peripheral transistor PTR and the substrate SUB. Each of the stacked active patterns PCH may be disposed at the same level as a corresponding one of the semiconductor patterns SP stacked on the cell region CAR. Each of the stacked second semiconductor layers SL2 may be disposed at the same level as a corresponding one of the insulating layers IL stacked on the cell region CAR.

Figure 15:
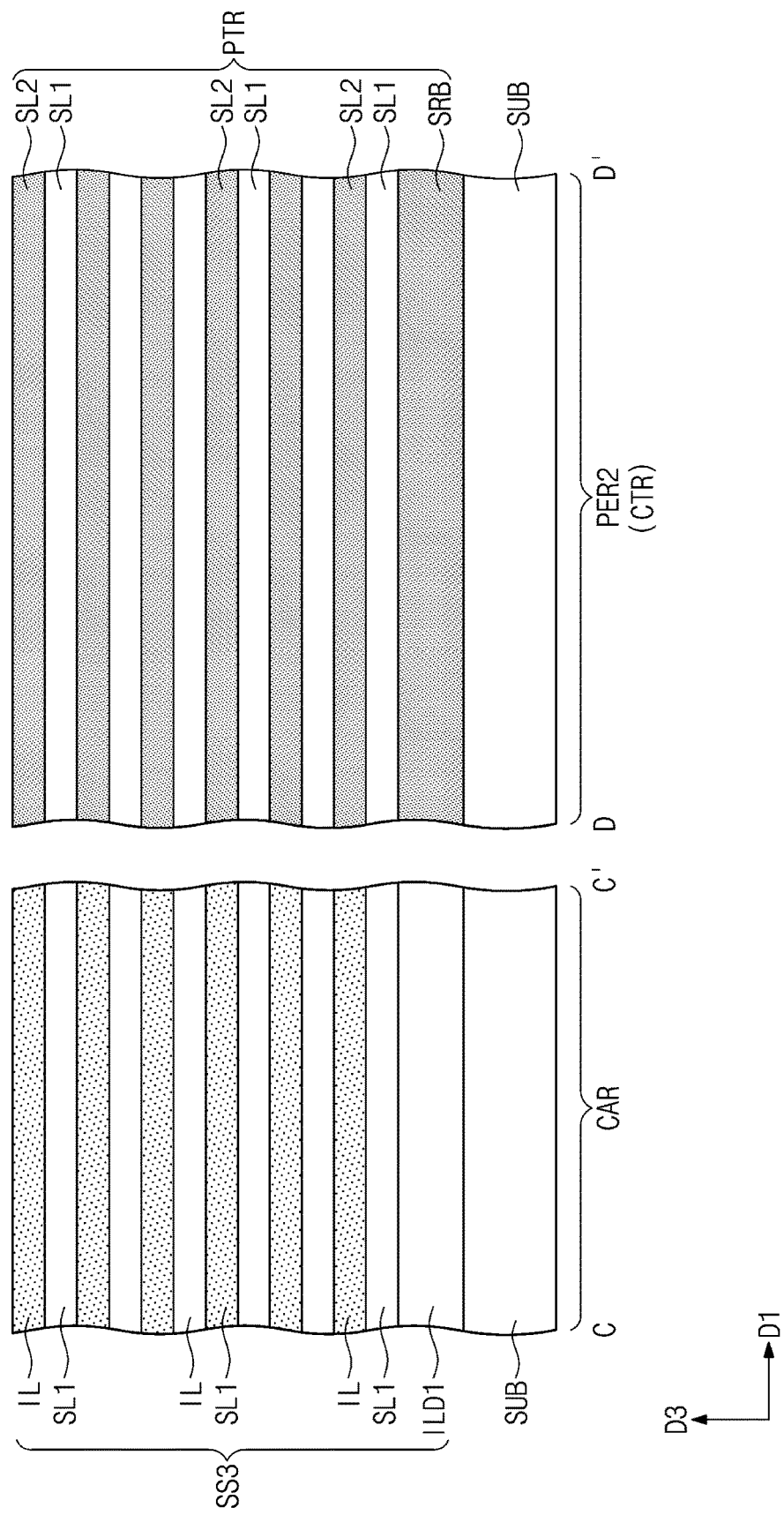
FIG. 15 is a sectional view taken along lines C-C' and D-D' of FIG. 3 to illustrate a method of fabricating a three-dimensional semiconductor memory device according to the embodiment of FIG. 14.

FIG. 15 is a sectional view taken along lines C-C' and D-D' of FIG. 3 to illustrate a method of fabricating a three-dimensional semiconductor memory device according to the embodiment of FIG. 14. Referring to FIGS. 3 and 15, after forming the resulting structure of FIG. 7, the second semiconductor layers SL2 on the cell region CAR may be replaced with the insulating layers IL. However, the second semiconductor layers SL2 and the buffer layer SRB on the first and second peripheral circuit regions PER1 and PER2 may not be replaced with the insulating layer and may remain in the structure of FIG. 14. The semiconductor stack SLS on the first and second peripheral circuit regions PER1 and PER2 may serve as the channel region of the peripheral transistor PTR.

Figure 16:
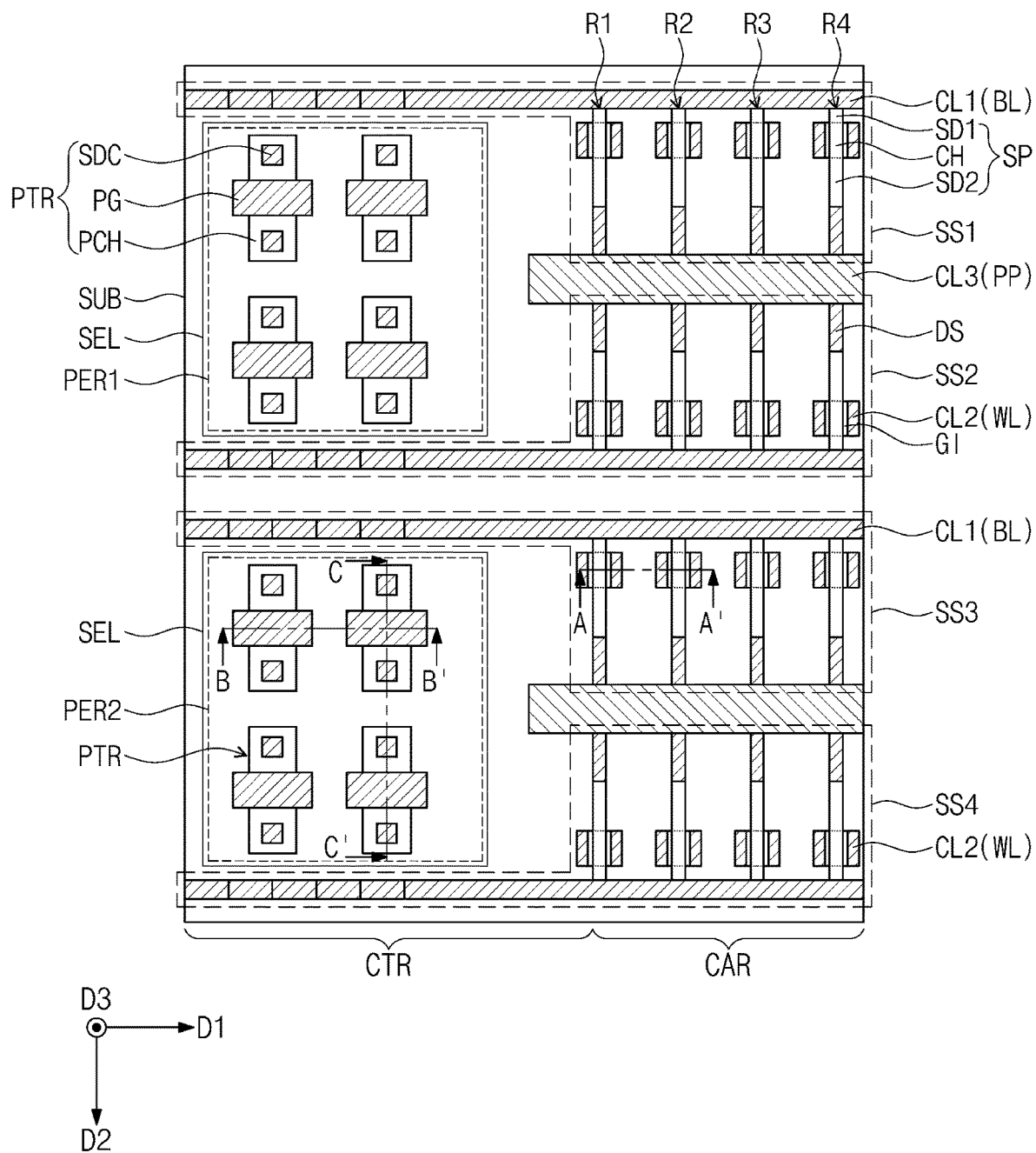
FIG. 16 is a plan view illustrating a semiconductor memory device according to an embodiment of the inventive concept.
Figure 17A:
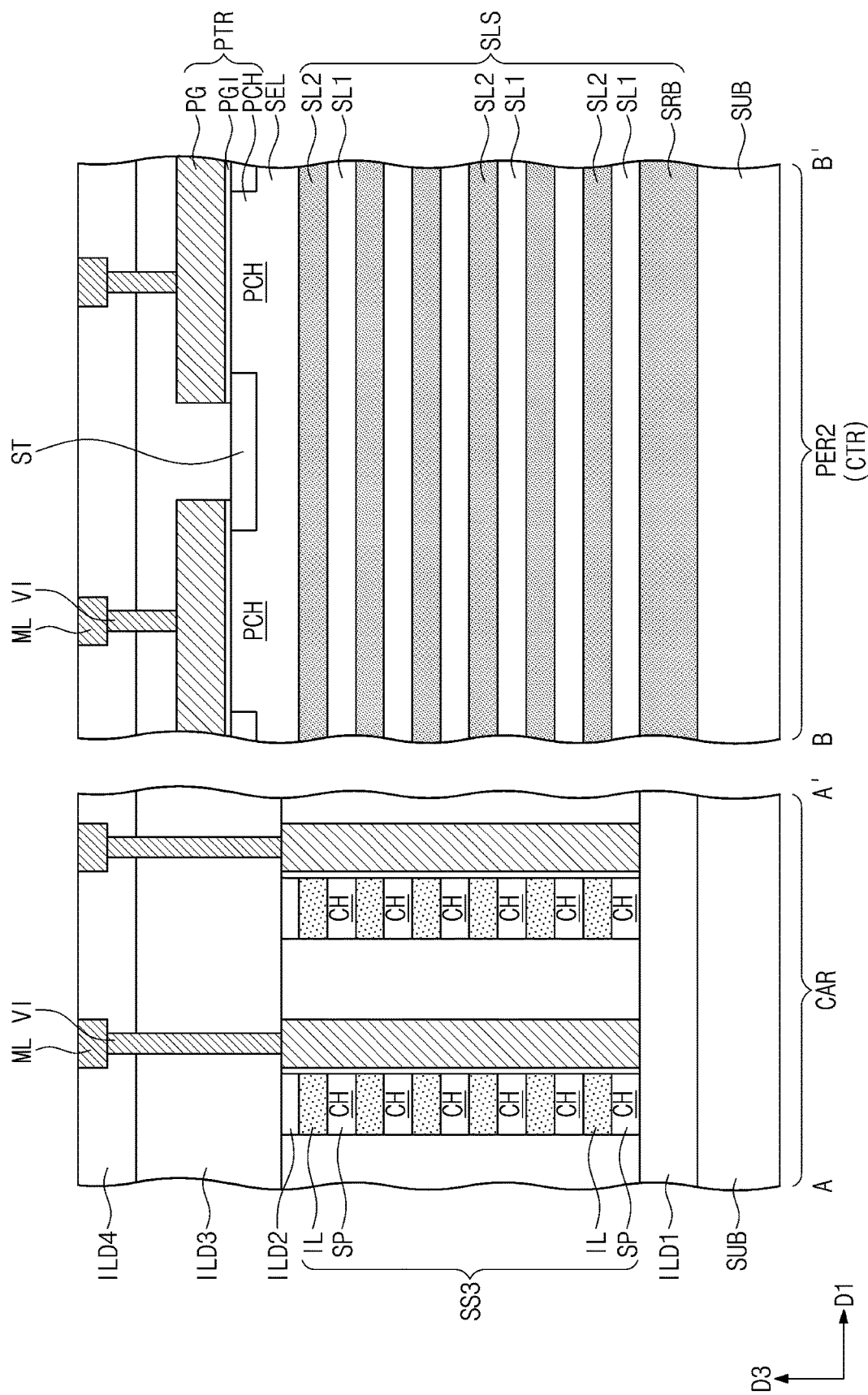
FIG. 17A is a sectional view taken along lines A-A' and B-B' of FIG. 16.
Figure 17B:
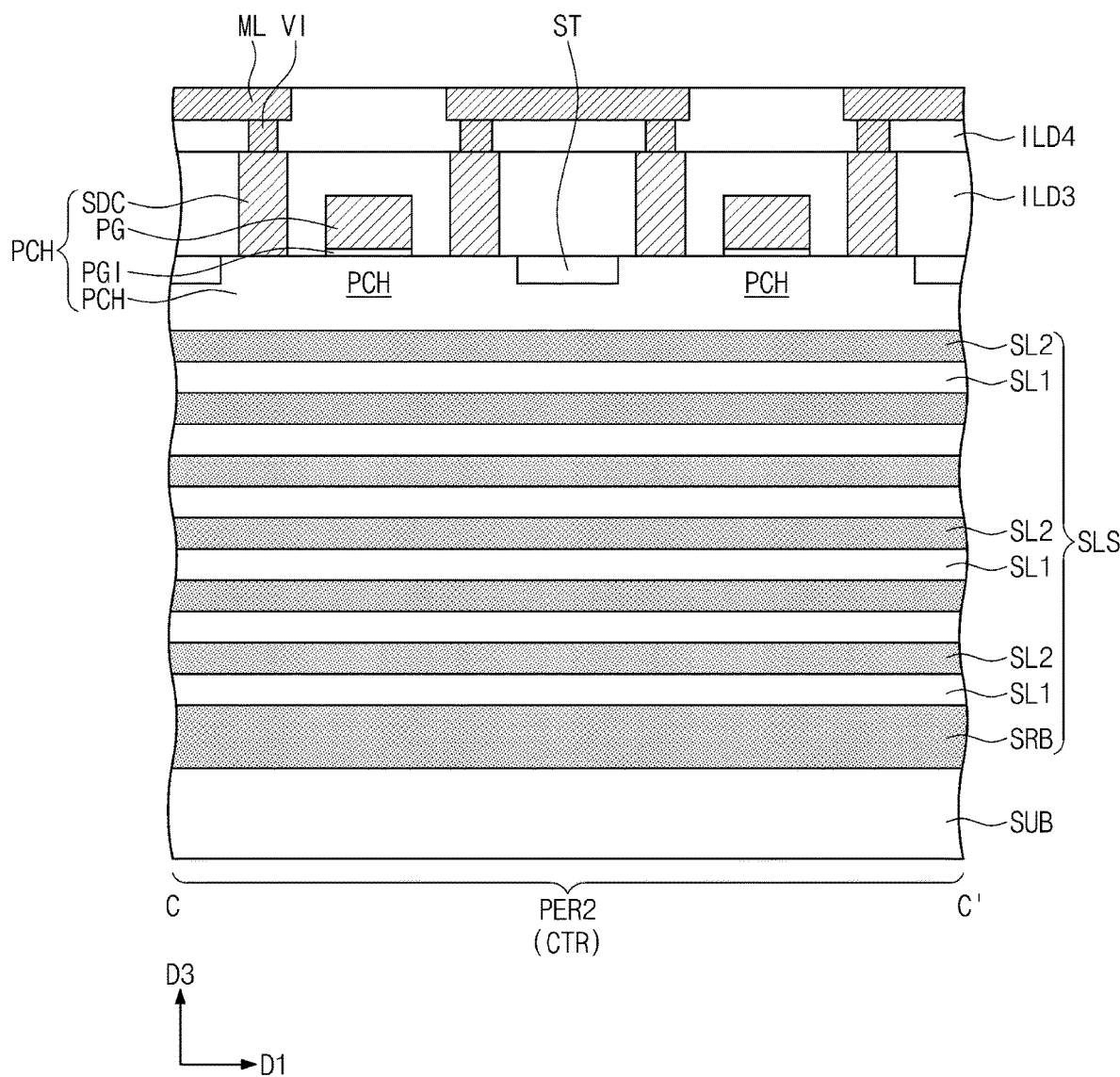
FIG. 17B is a sectional view taken along line C-C' of FIG. 16.

FIG. 16 is a plan view illustrating a semiconductor memory device according to an embodiment of the inventive concept. FIG. 17A is a sectional view taken along lines A-A' and B-B' of FIG. 16. FIG. 17B is a sectional view taken along line C-C' of FIG. 16. Referring to FIGS. 16, 17A, and 17B, the semiconductor stack SLS may be provided on the first and second peripheral circuit regions PER1 and PER2. The semiconductor stack SLS may be the semiconductor stack SLS left on the first and second peripheral circuit regions PER1 and PER2, as previously described with reference to FIG. 15. An upper semiconductor layer SEL may be provided on the semiconductor stack SLS of the first and second peripheral circuit regions PER1 and PER2. The upper semiconductor layer SEL may be positioned at a level higher than the uppermost pattern of the semiconductor patterns SP stacked on the cell region CAR. A plurality of peripheral transistors PTR may be provided on the upper semiconductor layer SEL. The peripheral transistors PTR according to the present embodiment may be planar FETs, unlike the three-dimensional transistor (e.g., MBCFET or GAAFET) described above. The peripheral transistors PTR according to the present embodiment may be positioned at a higher level than the first to fourth stacks SS1-SS4 on the cell region CAR.

In detail, the device isolation layer ST may be provided on the upper semiconductor layer SEL to define the active patterns PCH of the peripheral transistors PTR. The peripheral gate electrode PG may be provided on each of the active patterns PCH. A pair of the source/drain contacts SDC may be provided to be coupled to source and drain regions, respectively, of each of the active patterns PCH.

The third interlayered insulating layer ILD3 may be provided on the upper semiconductor layer SEL to cover the peripheral transistors PTR. A fourth interlayered insulating layer ILD4 may be provided on the third interlayered insulating layer ILD3. A plurality of the interconnection lines ML may be provided in the fourth interlayered insulating layer ILD4.

Figure 18:
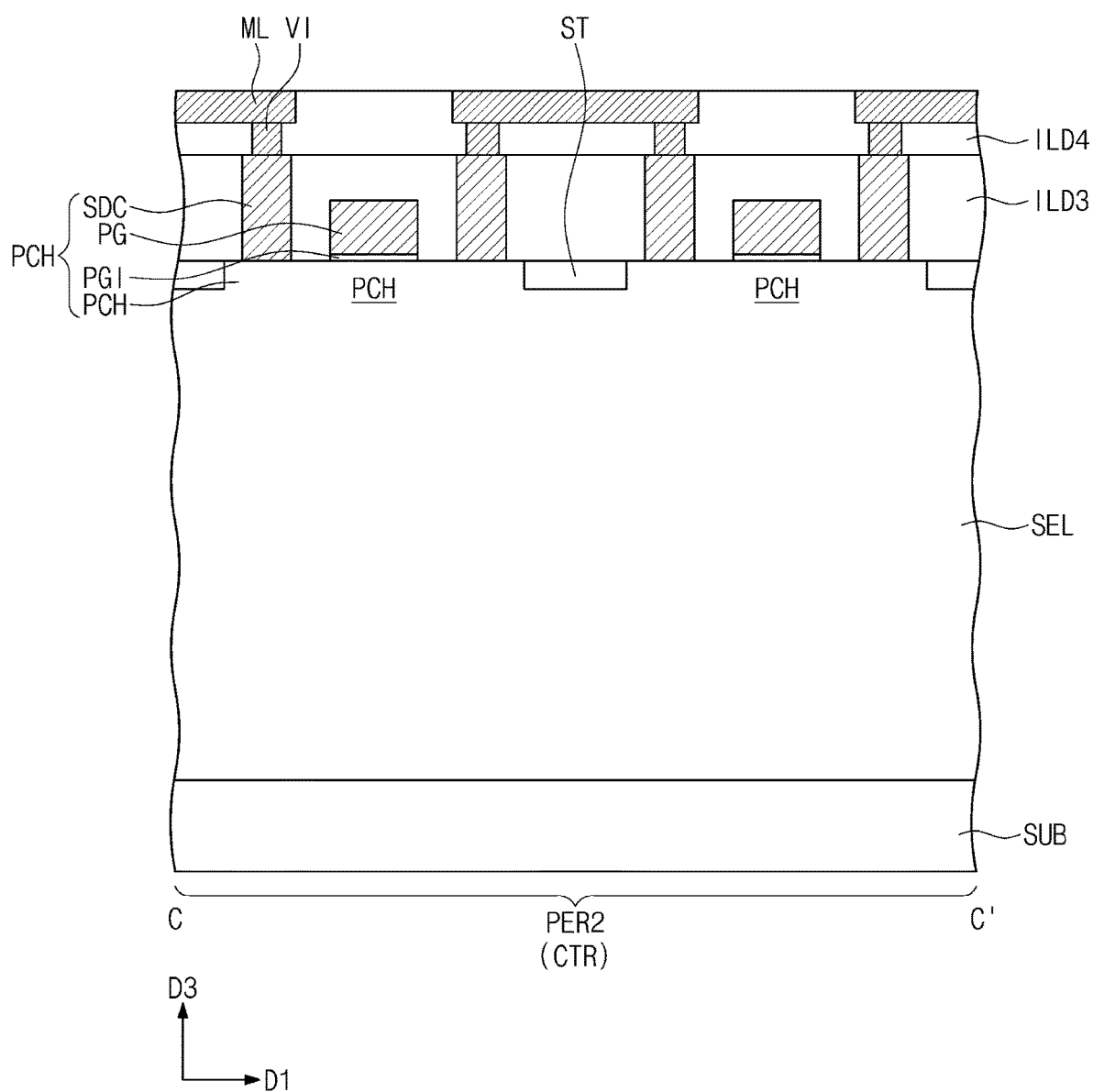
FIG. 18 is a sectional view taken along line C-C' of FIG. 16.

FIG. 18 is a sectional view taken along line C-C' of FIG. 16. Referring to FIGS. 16 and 18, the upper semiconductor layer SEL may be provided on the first and second peripheral circuit regions PER1 and PER2. The upper semiconductor layer SEL may be directly formed on the substrate SUB. That is, in the semiconductor memory device of FIG. 18, the semiconductor stack SLS on the first and second peripheral circuit regions PER1 and PER2 may be omitted.

Figure 19:
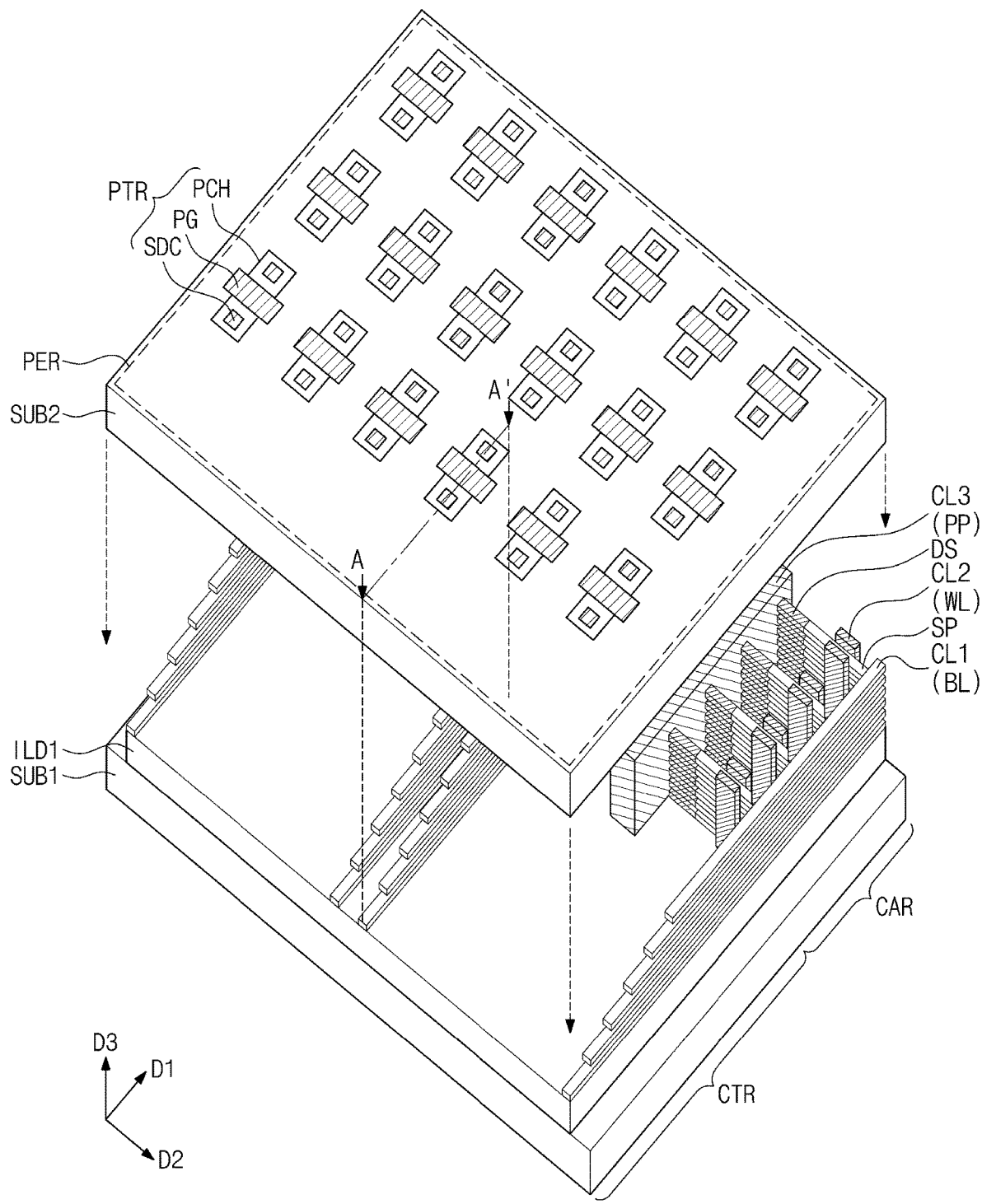
FIG. 19 is a perspective view illustrating a three-dimensional semiconductor memory device according to an embodiment of the inventive concept.
Figure 20:
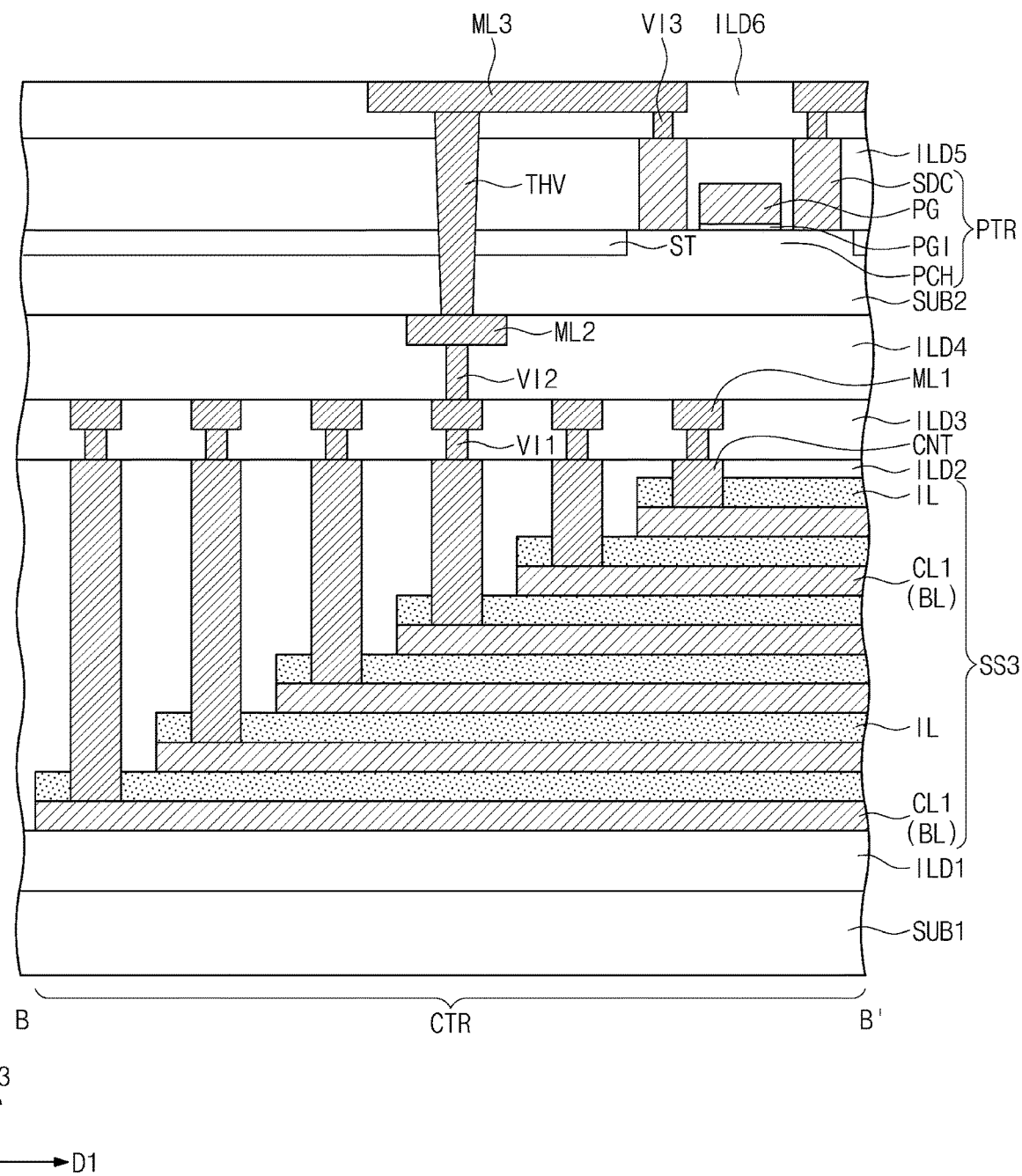
FIG. 20 is a sectional view taken along line A-A' of FIG. 19.

FIG. 19 is a perspective view illustrating a three-dimensional semiconductor memory device according to an embodiment of the inventive concept. FIG. 20 is a sectional view taken along line A-A' of FIG. 19. In the following description, an element previously described with reference to FIGS. 2, 3, and 4A to 4D may be identified by the same reference number without repeating an overlapping description thereof.

Referring to FIGS. 19 and 20, a first substrate SUB1 including the cell region CAR and the contact region CTR may be provided. The first substrate SUB1 may be a silicon wafer, a germanium wafer, or a silicon-germanium wafer.

The first to fourth stacks SS1-SS4 may be provided on the first substrate SUB1. The third interlayered insulating layer ILD3 may be provided on the first to fourth stacks SS1-SS4. A plurality of first interconnection lines ML1 may be provided in the third interlayered insulating layer ILD3. At least one of the first interconnection lines ML1 may be electrically connected to the first conductive line CL1 through a first via VI and the contact CNT.

The fourth interlayered insulating layer ILD4 may be provided on the third interlayered insulating layer ILD3. A second interconnection line ML2 may be provided in the fourth interlayered insulating layer ILD4. The second interconnection line ML2 may be electrically connected to the first interconnection line ML1 through a second via VI2.

A second substrate SUB2 including a peripheral circuit region PER may be provided on the fourth interlayered insulating layer ILD4. The peripheral circuit region PER of the second substrate SUB2 may be vertically overlapped with the cell region CAR and the contact region CTR of the first substrate SUB1. Although not shown, an adhesive layer may be interposed between the second substrate SUB2 and the fourth interlayered insulating layer ILD4. The adhesive layer may be used to attach the second substrate SUB2 to the fourth interlayered insulating layer ILD4. The second substrate SUB2 may be a silicon wafer, a germanium wafer, or a silicon-germanium wafer. For example, the second substrate SUB2 may be a single crystalline silicon wafer.

A plurality of the peripheral transistors PTR may be provided on the second substrate SUB2. In detail, the device isolation layer ST may be provided on the second substrate SUB2 to define the active patterns PCH of the peripheral transistors PTR. The peripheral gate electrode PG may be provided on each of the active patterns PCH. A pair of the source/drain contacts SDC may be provided to be coupled to source and drain regions, respectively, of each of the active patterns PCH.

A fifth interlayered insulating layer ILD5 and a sixth interlayered insulating layer ILD6 may be provided on the second substrate SUB2 to cover the peripheral transistors PTR. A plurality of third interconnection lines ML3 may be provided in the sixth interlayered insulating layer ILD6. Each of the third interconnection lines ML3 may be electrically connected to the source/drain contact SDC or the peripheral gate electrode PG through a third via VI3.

A through via THV may be provided to penetrate the fifth interlayered insulating layer ILD5 and the second substrate SUB2, and in an embodiment, the second interconnection line ML2 and the third interconnection line ML3 may be vertically connected to each other through the through via THV. For example, the first conductive line CL1 on the first substrate SUB may be electrically connected to the peripheral transistor PTR on the second substrate SUB through the through via THV. Although not shown, an insulating spacer may be interposed between the through via THV and the second substrate SUB2.

In a three-dimensional semiconductor memory device according to an embodiment of the inventive concept, a peripheral circuit region may include stepwise structures on a contact region of a substrate. Accordingly, it may be possible to reduce an area of the semiconductor memory device. A peripheral transistor on the peripheral circuit region may be formed concurrently with a stack on a cell region. Thus, it may be possible to simplify a fabrication process and to improve process efficiency. The peripheral transistor may have a multi-channel structure, like the stack on the cell region. Accordingly, it may be possible to increase an effective width of a channel region of the peripheral transistor, on a given small area.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a substrate having a cell region and a contact region, the contact region comprising a peripheral circuit region;
a first stack and a second stack on the cell region of the substrate; and
a first peripheral transistor on the peripheral circuit region,
wherein each of the first and second stacks comprises:
  semiconductor patterns stacked, in a vertical direction with respect to an upper surface of the substrate, on the cell region;
  bit lines stacked in the vertical direction on the cell region and respectively connected to first ends of the semiconductor patterns, each of the bit lines extending, in a horizontal direction with respect to the upper surface of the substrate, from the cell region to the contact region; and
  a word line disposed adjacent to the semiconductor patterns and extending in the vertical direction from the cell region of the substrate, and
wherein the first peripheral transistor is disposed between the bit lines of the first stack and the bit lines of the second stack.

2. The semiconductor memory device of claim 1, wherein the first peripheral transistor comprises:
first active patterns stacked in the vertical direction on the peripheral circuit region; and
a peripheral gate electrode disposed adjacent to the first active patterns and extending in the vertical direction from the peripheral circuit region.

3. The semiconductor memory device of claim 2, wherein the peripheral gate electrode comprises a pair of first and second peripheral gate electrodes, and the first and second peripheral gate electrodes are disposed on opposite sides, respectively, of each of the active patterns.

4. The semiconductor memory device of claim 2, wherein the peripheral gate electrode surrounds each of the active patterns.

5. The semiconductor memory device of claim 2, wherein the first peripheral transistor further comprises a body contact line connected to each of the active patterns and extending in the vertical direction from the peripheral circuit region.

6. The semiconductor memory device of claim 2, further comprising:
a second peripheral transistor disposed on the peripheral circuit region and adjacent to the first peripheral transistor; and
a shielding line disposed on the peripheral circuit region and interposed between the peripheral gate electrode of the first peripheral transistor and a peripheral gate electrode of the second peripheral transistor.

7. The semiconductor memory device of claim 2, further comprising:
a second peripheral transistor disposed on the peripheral circuit region and adjacent to the first peripheral transistor,
wherein the first peripheral transistor further comprises a first source/drain contact penetrating the first active patterns,
the second peripheral transistor comprises second active patterns and a second source/drain contact penetrating the second active patterns, and
a vertical level of a bottom surface of the first source/drain contact is different from a vertical level of a bottom surface of the second source/drain contact.

8. The semiconductor memory device of claim 2, wherein the first peripheral transistor further comprises semiconductor layers,
each of the active patterns and each of the semiconductor layers are alternately stacked in the vertical direction on the peripheral circuit region,
the active patterns comprise silicon, and
the semiconductor layers comprise silicon-germanium.

9. The semiconductor memory device of claim 1, further comprising:
an interconnection line on the first and second stacks,
wherein at least one of the bit lines is electrically connected to the first peripheral transistor through the interconnection line.

10. The semiconductor memory device of claim 1, wherein each of the first and second stacks further comprises: capacitors respectively connected to second ends of the semiconductor patterns.

11. A semiconductor memory device, comprising:
a substrate including a cell region and a peripheral circuit region;
a stack on the cell region; and
a peripheral transistor on the peripheral circuit region,
wherein the stack comprises:
  semiconductor patterns stacked, in a vertical direction with respect to an upper surface of the substrate, on the cell region;
  bit lines stacked in the vertical direction on the cell region and respectively connected to the semiconductor patterns, each of the bit lines extending in a horizontal direction with respect to the upper surface of the substrate; and
  a word line disposed adjacent to the semiconductor patterns and extending in the vertical direction from the cell region, and
wherein the peripheral transistor comprises:
  active patterns stacked in the vertical direction on the peripheral circuit region; and
  a peripheral gate electrode disposed adjacent to the active patterns and extending in the vertical direction from the peripheral circuit region.

12. The semiconductor memory device of claim 11, wherein each of the active patterns is positioned at the same vertical level as a corresponding one of the semiconductor patterns.

13. The semiconductor memory device of claim 11, wherein the peripheral gate electrode comprises a pair of first and second peripheral gate electrodes, and the first and second peripheral gate electrodes are disposed on opposite sides, respectively, of each of the active patterns.

14. The semiconductor memory device of claim 11, wherein the peripheral gate electrode surrounds each of the active patterns.

15. The semiconductor memory device of claim 11, wherein the peripheral transistor further comprises: semiconductor layers stacked in the vertical direction on the peripheral circuit region, and wherein each of the active patterns and each of the semiconductor layers are alternately stacked in the vertical direction on the peripheral circuit region, the active patterns comprise silicon, and the semiconductor layers comprise silicon-germanium.

16. A semiconductor memory device, comprising:

a substrate having a cell region and a contact region;

a first stack and a second stack on the cell region of the substrate; and a peripheral transistor on the contact region, wherein each of the first and second stacks comprises:

semiconductor patterns stacked, in a vertical direction with respect to an upper surface of the substrate, on the cell region;

bit lines stacked in the vertical direction on the contact region and respectively connected to first ends of the semiconductor patterns, each of the bit lines extending, in a horizontal direction with respect to the upper surface of the substrate, from the cell region to the contact region; and a word line disposed adjacent to the semiconductor patterns and extending in the vertical direction from the cell region, wherein the bit lines have a stepwise structure on the contact region, and wherein the peripheral transistor is disposed between the stepwise structure of the first stack and the stepwise structure of the second stack.

17. The semiconductor memory device of claim 16, wherein the peripheral transistor comprises:

active patterns stacked in the vertical direction on the contact region of the substrate; and a peripheral gate electrode disposed adjacent to the active patterns and extending in the vertical direction from the contact region.

18. The semiconductor memory device of claim 17, wherein the peripheral gate electrode comprises a pair of first and second peripheral gate electrodes, and the first and second peripheral gate electrodes are disposed on opposite sides, respectively, of each of the active patterns.

19. The semiconductor memory device of claim 17, wherein the peripheral gate electrode is provided to surround each of the active patterns.

20. The semiconductor memory device of claim 17, wherein the peripheral transistor further comprises semiconductor layers, each of the active patterns and each of the semiconductor layers are alternately stacked in the vertical direction on the contact region of the substrate, the active patterns comprise silicon, and the semiconductor layers comprise silicon-germanium.

* * * * *